(12) United States Patent
Yan et al.

(10) Patent No.: US 8,283,853 B2
(45) Date of Patent: Oct. 9, 2012

(54) LIGHT-EMITTING DEVICE AND ARTICLE

(75) Inventors: Min Yan, Ballston Lake, NY (US);
Stefan Rakuff, Clifton Park, NY (US);
Xiaolei Shi, Niskayuna, NY (US);
Ri-An Zhao, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 148 days.

(21) Appl. No.: 12/751,680

(22) Filed: Mar. 31, 2010

(65) Prior Publication Data
US 2011/0241539 A1 Oct. 6, 2011

(51) Int. Cl.
*H05B 3/00* (2006.01)
*H01L 51/52* (2006.01)
*H01L 51/56* (2006.01)
*H01J 9/00* (2006.01)

(52) U.S. Cl. ............ 313/504; 313/112; 313/498; 445/24

(58) Field of Classification Search .................. None
See application file for complete search history.

(56) References Cited

U.S. PATENT DOCUMENTS

| | | | |
|---|---|---|---|
| 7,245,074 B2 | 7/2007 | Shiang | |
| 7,321,193 B2 | 1/2008 | Antoniadis et al. | |
| 7,498,735 B2 | 3/2009 | Cok | |
| 2004/0160165 A1 | 8/2004 | Yamauchi | |
| 2005/0174043 A1* | 8/2005 | Kiguchi et al. | 313/503 |
| 2005/0264178 A1* | 12/2005 | Lan et al. | 313/503 |
| 2005/0264182 A1* | 12/2005 | Seki | 313/503 |
| 2005/0280360 A1* | 12/2005 | Park | 313/504 |
| 2006/0125388 A1 | 6/2006 | Song et al. | |
| 2007/0182297 A1 | 8/2007 | Drazic et al. | |
| 2008/0164807 A1 | 7/2008 | Hofmann et al. | |
| 2008/0303419 A1 | 12/2008 | Fukuda | |
| 2009/0140638 A1* | 6/2009 | Asano | 313/504 |
| 2009/0243480 A1* | 10/2009 | Park | 313/504 |

FOREIGN PATENT DOCUMENTS

| | | |
|---|---|---|
| DE | 102008051012 A1 | 4/2010 |
| WO | 2006021202 A1 | 3/2006 |
| WO | 2006060251 A1 | 6/2006 |

OTHER PUBLICATIONS

Search Report and Written Opinion from corresponding PCT Application No. PCT/US2011/028246 dated Oct. 11, 2011.
Yamasaki et al., "Organic light-emitting device with an ordered monolayer of silica microspheres as a scattering medium", Applied Physics Letters, vol. 76, No. 10, pp. 1243-1245, Mar. 6, 2000.

\* cited by examiner

*Primary Examiner* — Ashok Patel
(74) *Attorney, Agent, or Firm* — Mary Louise Stanford

(57) ABSTRACT

A device including a layer comprising a light emissive area and a light non-emissive area. A light-extracting feature is disposed over the light non-emissive area. The light-extracting features can include surface aberrations and reflective index matching elements. A method of forming the device is also provided.

12 Claims, 16 Drawing Sheets

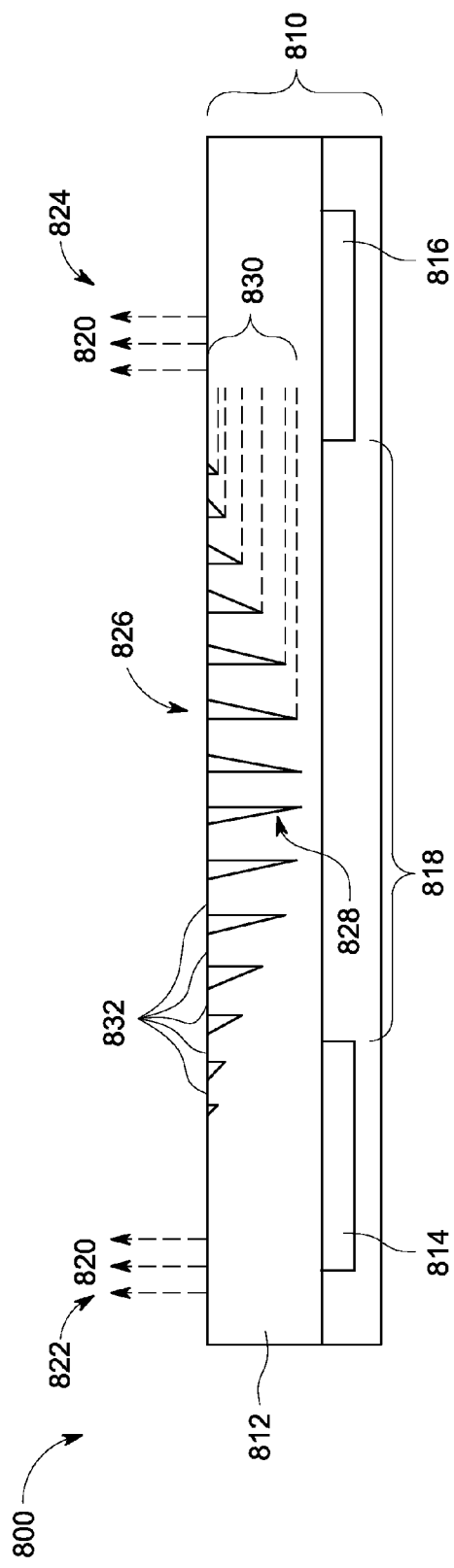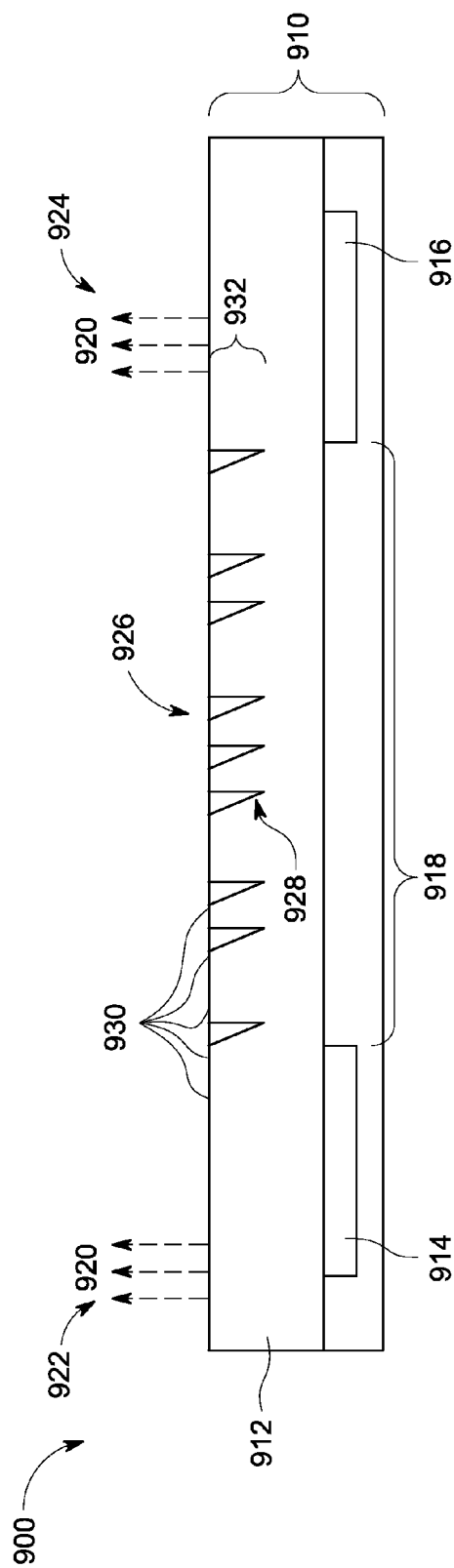

LIGHT-EMITTING DEVICE AND ARTICLE

BACKGROUND

The invention includes embodiments that relate to a device. More particularly the invention includes embodiments that relate to a light-emitting device and a method of making the device.

An organic light-emitting device (OLED) may be used for flat panel backlight applications or for general illumination. OLED generates light through radiative recombination of excitons on electrically excited organic molecules. OLEDs can be used for both display and lighting application. Typically, one of the electrodes in an OLED may have the property of being both transparent and conductive. A commonly used material for such transparent electrode is a transparent conducting oxide (TCO), for example, indium tin oxide (ITO) or aluminum-doped zinc oxide (AZO). When compared with metals, TCOs have much higher electric resistivity. Combined with the fact that OLEDs are current driven, the higher electric resistivity of TCO transparent electrode may cause a significant voltage change over large OLED pixels. When the TCO electrode is large in size for example, having a length of about 10 centimeters and a breadth of about 10 centimeters, the voltage change may be significant and may cause significant change of light intensity over the device. To overcome the high resistivity of TCO transparent electrode and still be able to make large OLED pixels, one approach is to divide the desired large area OLED device into separate smaller emitting pixels connected monolithically in series. The TCO electrode may be pixelized to small size (for example, 1 centimeter in current flow direction) so that the voltage change and hence the light intensity change over each pixel is not significant to a viewer. Due to the series electrical connection nature, the areas between the pixels where the monolithic series connections are located may not emit light. These areas can form the dark areas on the OLED surface thus forming a contrast between the area where light is emitted (an emissive area) and the dark areas (non-emissive areas). Many display and lighting applications may require that no dark area be seen when the OLEDs are powered.

For interior/exterior decorations and signage, it may be desirable to obtain a desired color output. It may be desirable to have a device which can provide efficient light output over the entire OLED and reduce the contrast between emissive area and non-emissive area to provide a uniformly lit OLED device.

BRIEF DESCRIPTION

In one embodiment, a device is provided. The device includes a layer comprising a light emissive area and a light non-emissive area. A light-extracting feature is disposed over the light non-emissive area.

A device is provided in another embodiment. The device includes a layer and a plurality of light-emitting elements disposed at a distance from each other on the layer. The layer defines a plurality of light-emissive areas and light non-emissive areas. The layer comprises a plurality of light emissive areas corresponding to the plurality of light-emitting elements and a plurality of light non-emissive areas corresponding to the distance between the plurality of light-emitting elements. A light-extracting feature is disposed over one or more of the plurality of light non-emissive areas in the layer.

A method is provided in yet another embodiment. The method comprises the steps of providing a layer that supports a plurality of light-emitting elements. The plurality of light-emitting elements can be disposed at a pre-determined distance from each other. This results in the formation of a plurality of light emissive areas, corresponding to the plurality of light-emitting elements on the layer and the formation of a plurality of light non-emissive areas, corresponding to the pre-determined distance between the light-emitting elements on the layer. The method further comprises the step of disposing a light extracting feature so as to correspond with the plurality of light non-emissive areas on the layer.

BRIEF DESCRIPTION OF THE DRAWINGS

FIG. 8 is a schematic view of a display device in accordance with one embodiment.

FIG. 9 is a schematic view of a display device in accordance with one embodiment.

DETAILED DESCRIPTION

Figure 1:
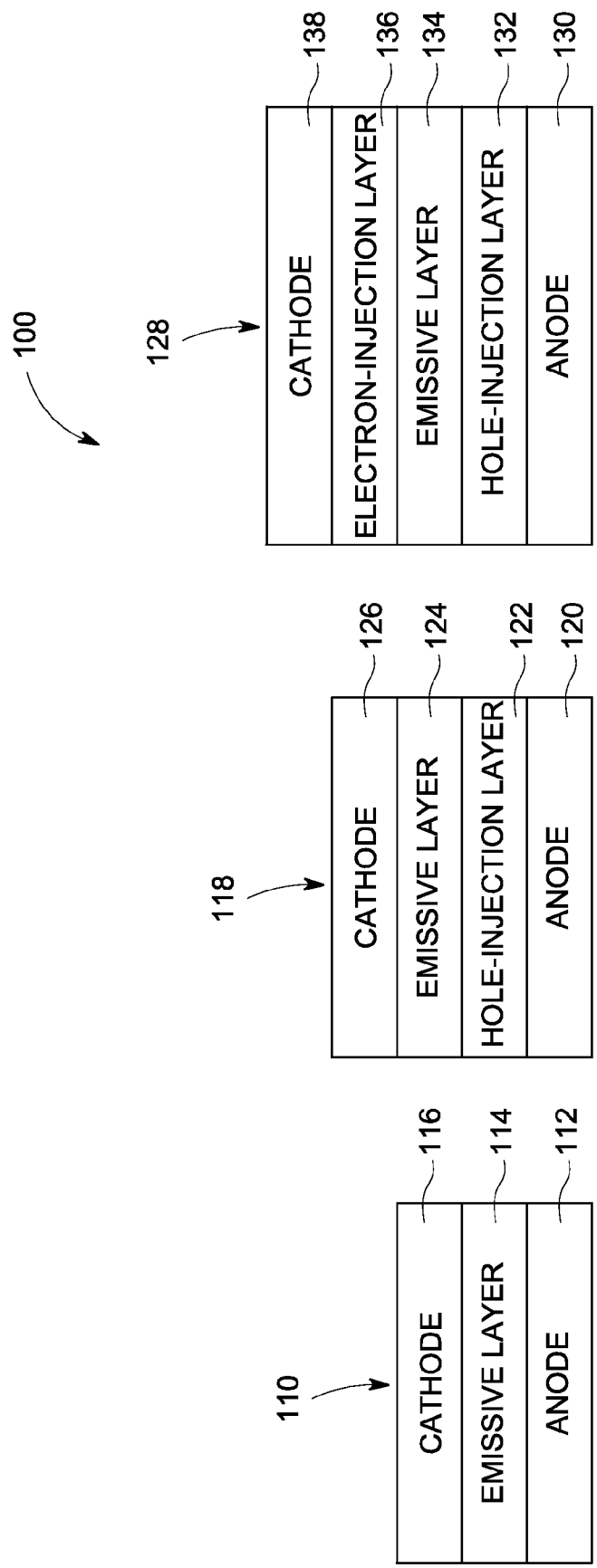
FIG. 1 is a schematic side view showing an OLED.

The singular forms "a", "an" and "the" include plural referents unless the context clearly dictates otherwise. Approximating language, as used herein throughout the specification and claims, may be applied to modify any quantitative representation that could permissibly vary without resulting in a change in the basic function to which it is related. Accordingly, a value modified by a term or terms, such as "about" is not limited to the precise value specified. In some instances, the approximating language may correspond to the precision of an instrument for measuring the value. Similarly, "free" may be used in combination with a term, and may include an insubstantial number, or trace amounts, while still being considered free of the modified term.

As used herein, the term "secured to" or "disposed over" or "deposited over" or "disposed between" refers to both secured or disposed directly in contact with and indirectly by having intervening layers therebetween. "Operably coupled"

is a relationship between listed parts that provides a stated function. Without further qualifiers, "light transmissive" means that greater than about 50 percent of light of at least one frequency in the visible wavelength range transmits through a material of a given thickness. The visible wavelength range is about 400 nanometers to about 700 nanometers. Some materials transmit more or less light based on the wavelength of the light. That is, a material that is light transmissive at one frequency may be more or less transmissive at another wavelength.

The term "alkyl" as used in the various embodiments is intended to designate linear alkyl, branched alkyl, aralkyl, cycloalkyl, bicycloalkyl, tricycloalkyl and polycycloalkyl radicals comprising carbon and hydrogen atoms. Alkyl groups may be saturated or unsaturated, and may comprise, for example, vinyl or allyl. The term "alkyl" also encompasses that alkyl portion of alkoxide groups. In various embodiments, normal and branched alkyl radicals are those containing from 1 to about 32 carbon atoms, and include as illustrative non-limiting examples C1-C32 alkyl (optionally substituted with one or more groups selected from C1-C32 alkyl, C3-C15 cycloalkyl or aryl); and C3-C15 cycloalkyl optionally substituted with one or more groups selected from C1-C32 alkyl or aryl. Examples include methyl, ethyl, n-propyl, isopropyl, n-butyl, sec-butyl, tertiary-butyl, pentyl, neopentyl, hexyl, heptyl, octyl, nonyl, decyl, undecyl and dodecyl. Some illustrative non-limiting examples of cycloalkyl and bicycloalkyl radicals include cyclobutyl, cyclopentyl, cyclohexyl, methylcyclohexyl, cycloheptyl, bicycloheptyl and adamantyl. In various embodiments, aralkyl radicals include those containing from 7 to about 14 carbon atoms; these include benzyl, phenylbutyl, phenylpropyl, and phenylethyl.

The term "aryl" as used in embodiments designates substituted or unsubstituted aryl radicals comprising from 6 to 20 ring carbon atoms. Some examples of aryl radicals include $C_6$-$C_{20}$ aryl optionally substituted with one or more groups selected from $C_1$-$C_{32}$ alkyl, $C_3$-$C_{15}$ cycloalkyl, aryl, and functional groups including atoms selected from Groups 15, 16 and 17 of the Periodic Table. Examples of aryl radicals include substituted or unsubstituted phenyl, biphenyl, tolyl, xylyl, naphthyl, and bi-napthyl.

Figure 2:
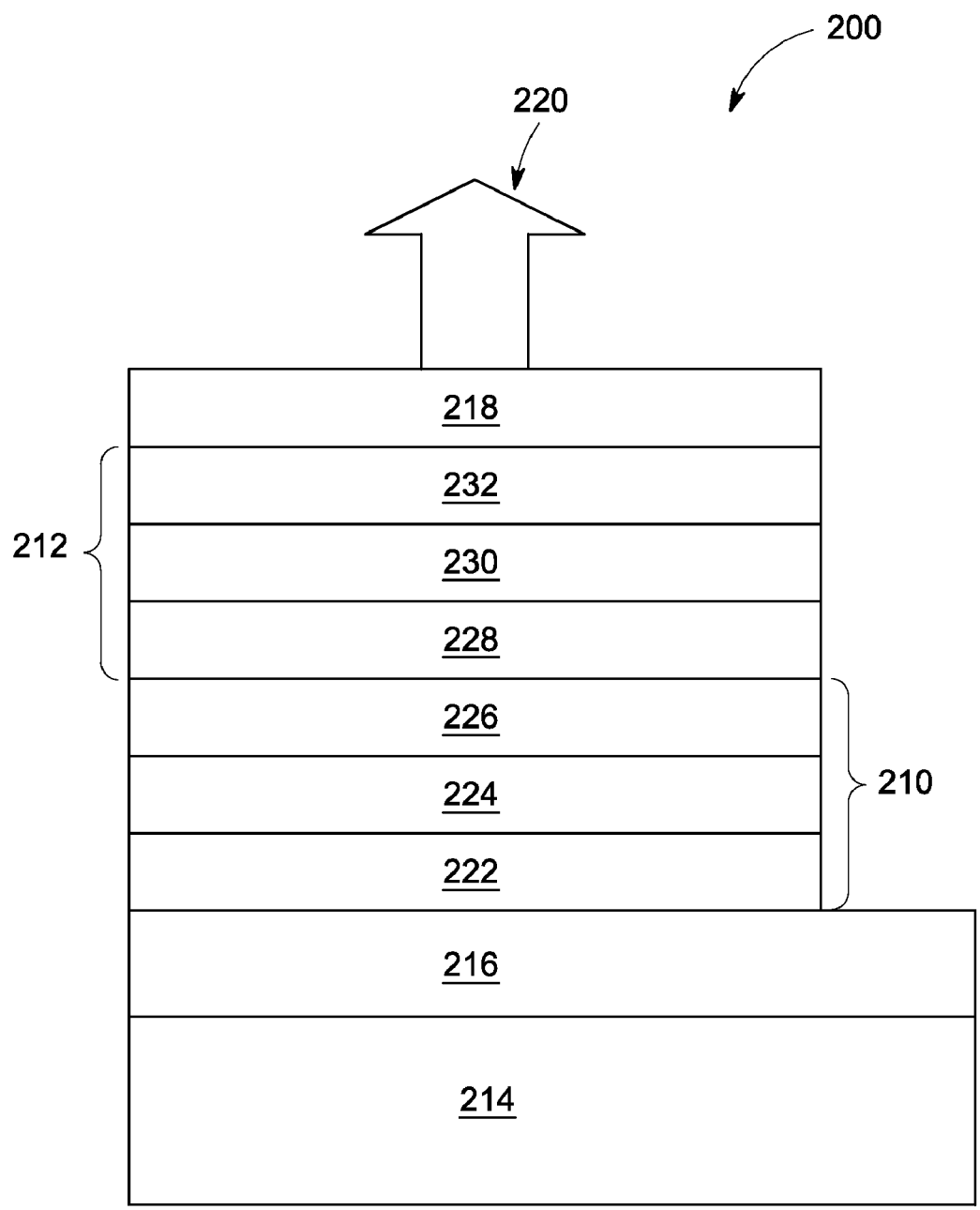
FIG. 2 is a schematic side view showing an OLED.

Referring to FIG. 1, a schematic side view 100 of varying OLED configurations is provided. In a first embodiment, an OLED 110 comprises an anode 112, an emissive layer 114 and a cathode 116. In a second embodiment, an OLED 118 comprises an anode 120, a hole-injection layer 122, an emissive layer 124, and a cathode 126. In a third embodiment an OLED 128 comprises an anode 130, a hole-injection layer 132, an emissive layer 134, an electron-injection layer 136, and a cathode 138. Typically OLED's are formed by stacking a series of layers as mentioned above to provide the desired color and light intensity. Referring to FIG. 2, therein is shown a schematic side view of an OLED 200 having two units, a first unit 210 and a second unit 212. The OLED 200 can comprise a substrate 214 on which are disposed an anode 216, a first unit 210, a second unit 212, and a cathode 218 through which the emitted light 220 is viewable. The first unit 210 can comprise a hole-transport layer 222, a first emissive layer 224, and a first electron-transport layer 226. The second unit 212 can comprise a second hole-transport layer 228, a second emissive layer 230, and a second electron-transport layer 232.

Suitable anodes 216 may include a material having a high work function; for example, greater than about 4.0 electron volts. In one embodiment, the anode material work function may be in a range of from about 5 electron volts to about 6 electron volts, or from about 6 electron volts to about 7 electron volts. Transparent metal oxides, such as indium tin oxide "ITO", or microfabricated metal grids, such as gold or sliver metal grids, may be used for this purpose. ITO is light transmissive and allows light emitted from the organic emissive layer to escape through the ITO anode without being seriously attenuated. Other materials suitable for use as the anode 216 are tin oxide, indium oxide, zinc oxide, indium zinc oxide, zinc indium tin oxide, antimony oxide, and mixtures thereof. In one embodiment, thickness of an anode 216 including such an electrically conducting oxide may be greater than about 10 nanometers. In one embodiment, the thickness of the anode 216 may be in the range of from about 10 nanometers to about 50 nanometers, from about 50 nanometers to about 100 nanometers, or from about 100 nanometers to about 200 nanometers.

In one embodiment, a thin transparent layer of a metal is suitable for the anode 216. A transparent metal layer may have a thickness of less than or equal to about 50 nanometers. In one embodiment, the metal thickness may be in a range of from about 50 nanometers to about 20 nanometers. Suitable metals for the anode may include, for example, silver, copper, tungsten, nickel, cobalt, iron, selenium, germanium, gold, platinum, aluminum, or mixtures thereof or alloys thereof. The anode 216 may be deposited on the underlying element by a technique such as physical vapor deposition, chemical vapor deposition, or sputtering.

The cathode 218 injects negative charge carriers. or electrons into the organic emissive layer and may be made of a material having a low work function; for example, less than about 4 electron volts. In various embodiments, not every material suitable for use as the cathode need have a low work function. Materials suitable for use as the cathode may include K, Li, Na, Mg, Ca, Sr, Ba, Al, Ag, In, Sn, Zn, Zr, Sc, and Y. Other suitable materials may include elements of the lanthanide series, alloys thereof, or mixtures thereof. Examples of suitable alloy materials for the manufacture of cathode layer may include Ag—Mg, Al—Li, In—Mg, and Al—Ca alloys. Layered non-alloy structures may be used. Such layered non-alloy structures may include a thin layer of a metal such as Ca having a thickness in a range of from about 1 nanometer to about 50 nanometers. Other such layered non-alloy structures may include a non-metal such as LiF, KF, or NaF, over-capped by a thicker layer of some other metal. A suitable other metal may include aluminum or silver. The cathode 218 may be deposited on the underlying layer by, for example, physical vapor deposition, chemical vapor deposition, or sputtering.

Suitable OLEDs may include an emissive layer 224, 230, which may be referred to as an organic emissive layer, an emission material layer, an electroluminiscent layer or as a light-emitting layer. Electroluminiscent (EL) materials refer to organic fluorescent and/or phosphorescent materials. Electroluminiscent materials emit light when subjected to an applied voltage bias. Electroluminiscent materials may be tailored to emit light in a determined wavelength range. In one embodiment, the thickness of the emissive layer 224, 230 may be greater than about 40 nanometers. In one embodiment, the thickness may be less than about 300 nanometers.

The electroluminiscent material used to form the emissive layer 224, 230 may be a polymer, a copolymer, or a mixture of polymers. Suitable electroluminescent materials may include poly N-vinylcarbazole (PVK) and its derivatives; polyfluorene and its derivatives, such as polyalkylfluorene, for example poly-9,9-dihexylfluorene, polydioctylfluorene, or poly-9,9-bis-3,6-dioxaheptyl-fluorene-2,7-diyl; poly paraphenylene and its derivatives, such as poly-2-decyloxy -1,4-phenylene or poly-2,5-diheptyl-1,4-phenylene; polyp-phenylene vinylene and its derivatives, such as dialkoxy-substituted PPV and cyano-substituted PPV; polythiophene and its derivatives, such as poly-3-alkylthiophene, poly-4,4'-dialkyl -2,2'-bithiophene, poly-2,5-thienylene vinylene; polypyridine vinylene and its derivatives; polyquinoxaline and its derivatives; and polyquinoline and its derivatives. In one embodiment, a suitable electroluminescent material is poly-9,9-dioctylfluorenyl-2,7-diyl end capped with N,N-bis 4-methylphenyl-4-aniline. Mixtures of these polymers or copolymers based on one or more of these polymers may be used. Other suitable materials that may be used as electroluminescent materials are polysilanes. Polysilanes are linear polymers having a silicon-backbone substituted with an alkyl and/or aryl side groups. Polysilanes are quasi one-dimensional materials with delocalized sigma-conjugated electrons along polymer backbone chains. Examples of polysilanes include poly di-n-butylsilane, poly di-n-pentylsilane, poly di-n-hexylsilane, polymethyl phenylsilane, and poly bis p-butyl phenylsilane.

In one embodiment, organic materials having molecular weight less than about 5000, including aromatic units, may be used as electroluminiscent materials to form the emissive layers $224$, $230$. An example of such materials is 1,3,5-tris N-4-diphenyl amino phenyl phenyl amino benzene, which emits light in the wavelength range of from about 380 nanometers to about 500 nanometers. These electroluminiscent layer organic materials may be prepared from organic molecules such as phenylanthracene, tetraarylethene, coumarin, rubrene, tetraphenylbutadiene, anthracene, perylene, coronene, or their derivatives. These materials may emit light having a maximum wavelength of about 520 nanometers. Still other suitable materials are the low molecular-weight metal organic complexes such as aluminum-acetylacetonate, gallium-acetylacetonate, and indium-acetylacetonate, which emit light in the wavelength range of about 415 nanometers to about 457 nanometers, aluminum picolymethylketone bis-2, 6-dibutylphenoxide or scandium-4-methoxy picolyl methyl ketone-bis acetyl acetonate, which emit light having a wavelength in a range of from about 420 nanometers to about 433 nanometers. Other suitable electroluminiscent materials that emit in the visible wavelength range may include organometallic complexes of 8-hydroxyquinoline, such as tris-8-quinolinolato aluminum and its derivatives.

The OLED $200$, for example as shown in FIG. 2 above, may further include one or more layers such as a hole transport layer $222$, $228$, an electron transport layer $226$, $232$, and other layers (not shown in figure) including a hole injection layer, a hole injection enhancement layer, as a charge transport layer, an electron injection layer, an electron injection enhancement layer, electron blocking layer, encapsulation layer, and light out-coupling layer or any combinations thereof. The various layers discussed herein may be disposed between the anode $216$ and the cathode $218$.

Non-limiting examples of materials suitable for use as charge transport layer that may be included in the OLED $200$, may include low-to-intermediate molecular weight organic polymers for example, organic polymers having weight average molecular weights $M_w$ of less than about 200,000 grams per mole as determined using polystyrene standards for example, poly-3,4-ethylene dioxy thiophene (PEDOT), polyaniline, poly-3,4-propylene dioxythiophene (PPropOT), polystyrene sulfonate (PSS), polyvinyl carbazole (PVK), and other like materials.

Non-limiting examples of materials suitable for the hole transport layer $222$, $228$ that may be included in the OLED $200$, may include triaryldiamines, tetraphenyldiamines, aromatic tertiary amines, hydrazone derivatives, carbazole derivatives, triazole derivatives, imidazole derivatives, oxadiazole derivatives including an amino group, polythiophenes, and like materials. Non-limiting examples of materials suitable for a hole-blocking layer that may be included in the OLED $200$, may include poly N-vinyl carbazole, and like materials.

Non-limiting examples of materials suitable for a hole-injection layer that may be included in the OLED $200$, may include "p-doped" proton-doped conducting polymers, such as proton-doped polythiophene or polyaniline, and p-doped organic semiconductors, such as tetrafluorotetracyanoquinodimethane (F4-TCQN), doped organic and polymeric semiconductors, and triarylamine-containing compounds and polymers. Non-limiting examples of electron-injection materials may include polyfluorene and its derivatives, aluminum tris-8-hydroxyquinoline (Alq3), organic/polymeric semiconductors n-doped with alkali alkaline earth metals, and the like.

Non-limiting examples of materials suitable for a hole injection enhancement layer that may be included in the OLED $200$, may include arylene-based compounds such as 3,4,9,10-perylene tetra-carboxylic dianhydride, bis-1,2,5-thiadiazolo-p-quino bis-1,3-dithiole, and like materials.

Non-limiting examples of materials suitable for the electron injection enhancement layer that may be included in the OLED $200$, and electron transport layers $226$, $232$ may include metal organic complexes such as oxadiazole derivatives, perylene derivatives, pyridine derivatives, pyrimidine derivatives, quinoline derivatives, quinoxaline derivatives, diphenylquinone derivatives, nitro-substituted fluorene derivatives, and like materials.

Non-limiting examples of materials suitable for the electron blocking layer that may be included in the OLED $200$, may include N,N'-dicarbazolyl-3,5-benzene (hereinafter mCP), 4,4'-N,N'-dicarbazole-biphenyl (hereinafter CBP), 1,4-dicarbazol-9-yl-benzene (hereinafter CCP), or 1,3,5-tris (N-carbazolyl)benzene (hereinafter TCB).

Non-limiting examples of materials suitable for the encapsulation layer that may be included in the OLED $200$, may include materials that are capable of protecting the OLED devices from being damaged either physically or chemically. Physical damage includes scratching, direct impacting, punching, and the like. Chemical damage includes electrochemical degrading of organic layers in OLED devices due to presence of moisture, oxygen and other reactive species. The encapsulation layer may incorporate a protection layer and an adhesive layer. In one embodiment, the protection layer may be a metal foil or a polymeric film coated with a gas barrier coating. In one embodiment, the adhesive layer may include one or more of a thermoplastic adhesive, a thermosetting adhesive, such as for example a Ultra-violet light curable adhesive, and a pressure sensitive adhesive.

Non-limiting examples of materials suitable for the light out-coupling layer that may be included in the OLED $200$, may include any suitable material that is capable of extracting more light from the OLED devices. The light out-coupling layer might comprise materials that have a refractive index roughly equal to the light transmissive layer of the OLED to which the light out-coupling layer is attached. The shape and/or geometry of the light extraction elements used in light out-coupling layer are designed so as to enhance the out-coupling of light from the device.

Figure 3:
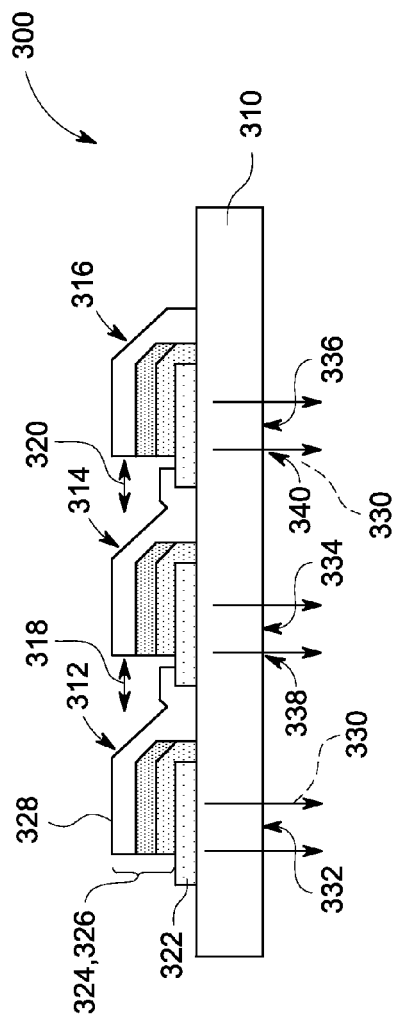
FIG. 3 is a schematic side view of a display device in accordance with one embodiment.
Figure 4:
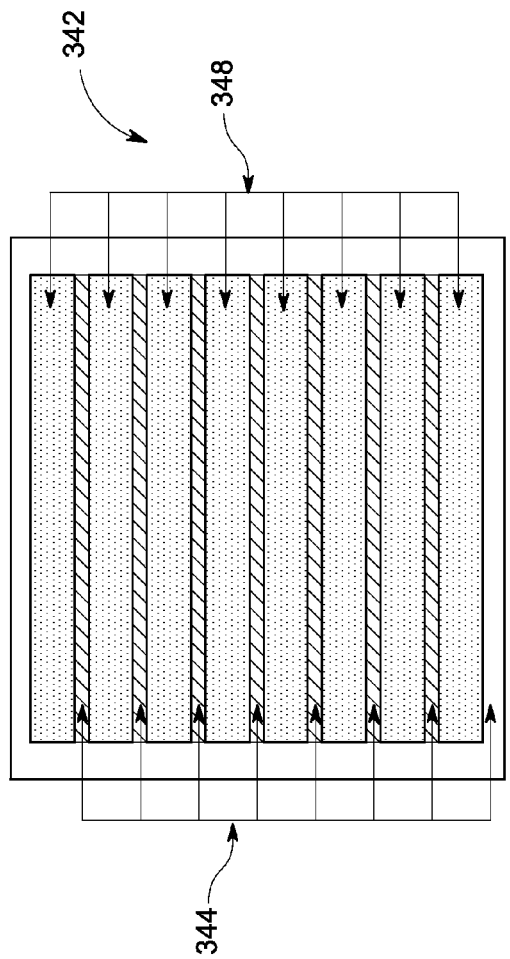
FIG. 4 is a schematic top view of a display device in accordance with one embodiment.

Referring to FIG. 3, a schematic side view of a display device $300$ is provided. The device $300$ can include a substrate $310$ with a plurality of OLEDs $312$, $314$, and $316$ disposed at a distance $318$ and $320$, over the substrate $310$. Each of the OLEDs $312$, $314$, and $316$ can comprise an anode $322$, organic emissive layers $324$ and $326$, and a cathode $328$. The light 330 emitted from the organic emissive layers 324 and 326 can pass through the transparent anode layer 318 and the substrate 310. The light emissive areas 332, 334, and 336 on the substrate 310 roughly correspond to the OLEDs 312, 314, and 316. The light non-emissive areas 338, and 340, on the substrate roughly correspond to the distances 318, and 320, at which the OLEDs are disposed on the substrate 310. Referring to FIG. 4, a schematic top view 342 of the display device 300 is provided. As shown in the top view 342 of the device the light non-emissive areas 344 may appear as dark areas between the light emissive areas 348.

Figure 5:
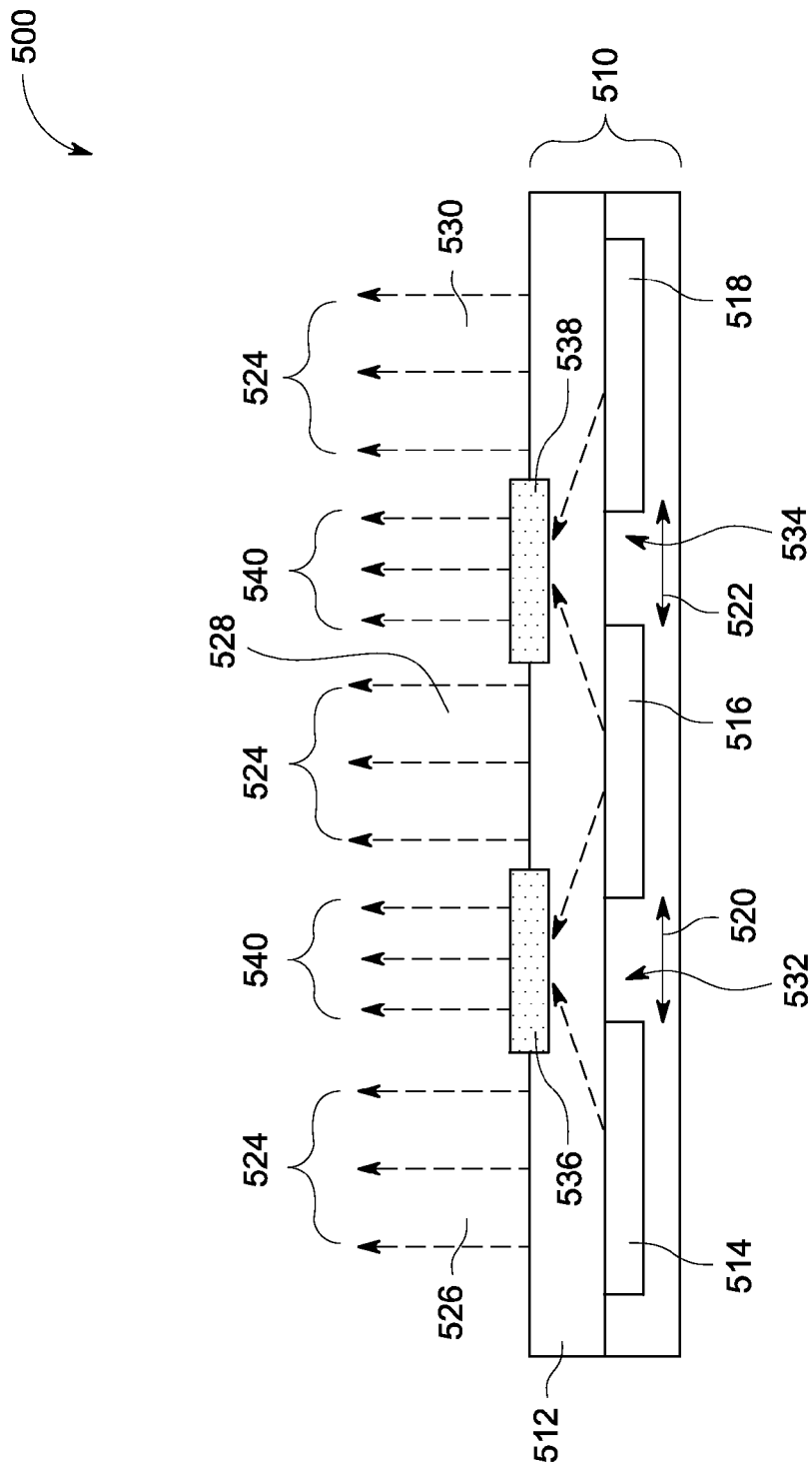
FIG. 5 is a schematic view of a display device in accordance with one embodiment.

In one embodiment, a device, for example, a display device 500, referred to in FIG. 5, is provided. The device 500 can include a layer 510 defining a light emissive area 526, 528, 530 and a light non-emissive area 532, 534. For example, the layer 510 can include a substrate 512 with a plurality of OLEDs 514, 516, and 518 disposed at a distance 520, and 522, over the substrate 512. The OLEDs 514, 516, 518 may, for example, be configured as shown in FIGS. 1 and/or 2. The light 524 emitted from the OLEDs 514, 516, and 518 can pass through the substrate 512. The light emissive areas 526, 528, and 530, defined on the layer 510 roughly correspond to the OLEDs 514, 516, and 518. The light non-emissive areas 532 and 534, defined on the layer 510 roughly correspond to the distances 520 and 522, at which the OLEDs 514, 516, and 518 are disposed on the substrate 512. Light-extracting features 536 and 538 can be disposed over some or all of the light non-emissive areas 532 and 534. The light-extracting features 536 and 538 may serve to extract the light 540 from the layer 510. In certain embodiments, light extracting features 536 and 538 can additionally be disposed over some or all of the light emissive areas 526, 528, and 530, such that different types of light extracting features can be disposed over the light non-emissive areas and the light emissive areas. For example, in one embodiment, the light extracting features discussed in FIG. 6 below including surface aberrations 636, 638 may be disposed over the light emissive areas and the light extracting features discussed in FIG. 10 below including refractive index matching elements 1036, 1038 may be disposed over the light non-emissive areas.

As used herein the phrase "light emissive area" means the area where the emissive material layer is undergoing radiative recombination of excitons on electrically excited organic molecules and will actively emit light. As use herein the phrase "light non-emissive area" means the area where no radiative recombination of exciton takes place and no light will actively emit.

In one embodiment, the layer 510 may comprise a plurality of organic and inorganic layers (e.g., the layers making up the OLEDs 514, 516, 518) disposed on the substrate 512. In one embodiment, the substrate 512 can include a light transmissive element (not shown). The substrate 512 may be formed from a light transmissive material. The light transmissive material can be clear in one embodiment. In another embodiment, the light transmissive material can have a color, tint, or optical effect inducing quality (such as opalescence or polarization). In one embodiment, without regard for wavelength or thickness, the amount of light transmitted through the substrate 512 is in a range of from about 60 percent to about 70 percent, from about 70 percent to about 80 percent, or from about 80 percent to about 90 percent of the light. In one embodiment, without regard for percent transmission or thickness, the transmitted light may have a wavelength in a range of from about 400 nanometers to about 500 nanometers, from about 500 nanometers to about 600 nanometers, or from about 600 nanometers to about 700 nanometers. In one embodiment, more than about 50 percent of the light at wavelength of about 550 nanometers is transmitted through the substrate without regard for the thickness. The above-discussed embodiments on the amount and the wavelength of transmitted light hold true for the light transmissive organic electronic devices, the resultant device and the article made therefrom. Thickness of various embodiments are disclosed hereinbelow.

The substrate 512 may be chosen from a group of rigid substrates and flexible substrates. The rigid substrates include but are not limited to glass, metal and plastic; and the flexible substrates include flexible glass, metal foil, and plastic films. Non-limiting examples of glass may include quartz glass and borosilicate glass. Non-limiting examples of plastic may include organic polymers. Suitable organic polymers may include thermoplastic polymers chosen from polyethylene terephthalate, polyethylene naphthalate, polyethersulfone, polycarbonate, polyimide, polyacrylate, polyolefin, and the like.

In one embodiment, the light emissive areas 526, 528, 530 may roughly correspond to light-emitting elements, for example OLEDs 514, 516, and 518, that may be disposed at a pre-determined portion of the layer 510. In one embodiment, the light non-emissive areas 532, 534 may roughly correspond to a portion of the layer not comprising the light-emitting elements.

Figure 6:
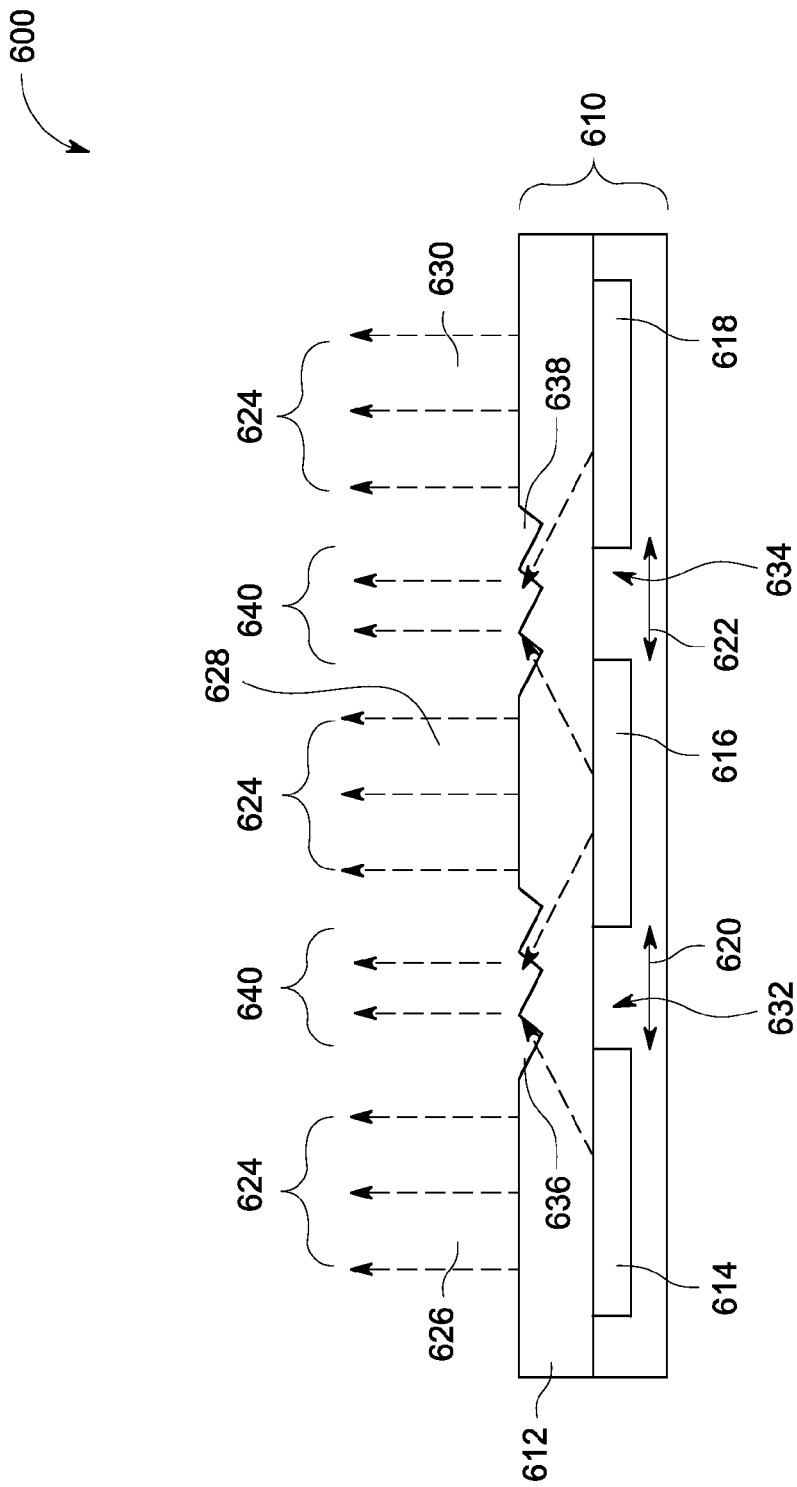
FIG. 6 is a schematic view of a display device in accordance with one embodiment.
Figure 7:
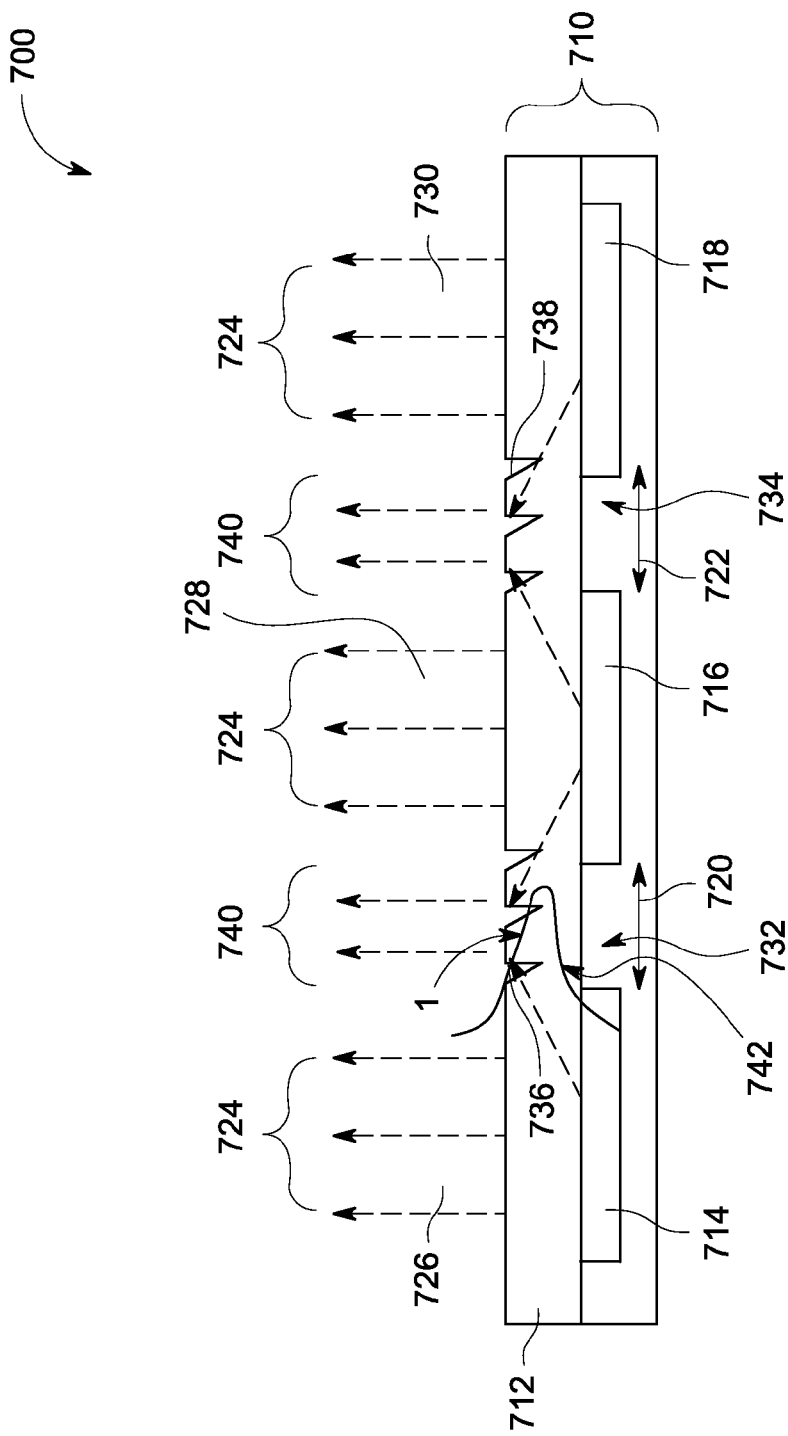
FIG. 7 is a schematic view of a display device in accordance with one embodiment.

In one embodiment, the light-extracting feature 536, 538 may include surface aberrations disposed over the light non-emissive area in the layer 510. As used herein the phrase "surface aberrations" refers to rough surface features defined on the surface 512 of the layer 510. For example, referring to FIG. 2, surface aberrations could be formed by physically modifying the surface of the transparent layer 218 of the OLED device 200. In one embodiment, the surface modification could include physically changing the surface corresponding to the light non-emissive areas by mechanically scratching, denting, and/or forming grooves on the surface of the corresponding portion of the layer 510, and/or by employing chemical processes that result in etching, ablating, and/or decomposition in specific portions of the layer 510. In one embodiment, the surface aberrations 536, 538 shown in FIG. 5 may include dents, scratches, and grooves, which serve to disrupt the continuity of the surface. Non-limiting examples of surface aberrations 536, 538 may include surface features that are carved into the surface of transparent layer of OLEDs. In one embodiment, the surface aberration feature can be in the form of point features as shown in FIG. 7, such as dents or dimples 736, 738. In various embodiments, point features can include a triangular, semi-circular, square, rectangle, pentagonal, or hexagonal cross-sectional shape. In another embodiment, the surface aberration features can be in the form of line features as shown in FIG. 6 such as scratches (636 and 638, thin shallow cuts or marks on a surface) or grooves (not shown in figure, long narrow channels or depressions). In various embodiments, the line feature may be a straight line, or a curved line. In various embodiments, the line surface aberration features can include a triangular, semi-circular, square, rectangle, pentagonal or hexagonal cross-sectional shape. The cross-sectional shape of the line feature can be uniform along the line feature or can change along the length of the line feature. In certain embodiments, the surface aberration features can be a combination of both the point features and the line feature.

Referring to FIG. 6, a schematic diagram of a display device 600 is provided. The device 600 can include a layer 610. The layer 610 can include a substrate 612 with a plurality of OLEDs 614, 616, and 618 disposed at a distance 620, and 622, over the substrate 612. The light 624 emitted from the OLEDs 614, 616, and 618 can pass through the substrate 612. The light emissive areas 626, 628, and 630 defined on the layer 610 roughly correspond to the OLEDs 614, 616, and 618. The light non-emissive areas 632 and 634 defined on the layer 610 roughly correspond to the distances 620, and 622 at which the OLEDs 614, 616, and 618 are disposed on the substrate 612. Light-extracting features, for example, scratches, 636 and 638, can be disposed over some or all of the light non-emissive areas 632 and 634. The scratches 636 and 638 can serve to enhance the extraction of light 640 from the layer 610, possibly providing a more uniformly lit display device 600. At least some of the light 640 extracted from the non-emissive areas using the scratches 636 and 638 may be light that would otherwise be subject to a wave-guide mode of propagation within the layer 610.

Referring to FIG. 7, a schematic diagram of a display device 700 is provided. The device 700 can include layer 710. The layer 710 can include a substrate 712 with a plurality of OLEDs 714, 716, and 718 disposed at a distance 720, and 722, over the substrate 712. The light 724 emitted from the OLEDs 714, 716, and 718 can pass through the substrate 712. The light emissive areas 726, 728, and 730 defined on the layer 710 roughly correspond to the OLEDs 714, 716, and 718. The light non-emissive areas 732 and 734 defined on the layer 710 roughly correspond to the distances 720, and 722, at which the OLEDs 714, 716, and 718 are disposed on the substrate 712. Light-extracting feature, for example, dents 736 and 738, can be disposed over some or all of the light non-emissive areas 732 and 734. In one embodiment, the dents 736, 738 can have a depth and a spacing of less than or equal to 100 micrometers. The dents 736 and 738 serve to extract the light 740 from the layer 710, possibly providing a more uniformly lit display device 700. At least some of the light 740 extracted from the non-emissive areas using the dents 736 and 738 may be light that would otherwise be subject to a wave-guide mode of propagation 742 within the layer 710.

The substrate waveguide mode 742, shown in FIG. 7, may have a certain field distribution (as shown below in FIG. 18). A deep dent 736, 738 may disturb the substrate waveguide mode 742 more strongly as the light intensity in the dented areas 736, 738 increases. As a result, a higher light extraction efficiency may be expected.

In one embodiment, the depth of the dents 736, 738 may be modified to obtain different extraction efficiencies from the substrate waveguide mode 742. In one embodiment, the depth of the dents 736, 738 can be used to achieve a balanced brightness between the light emissive areas and the light non-emissive areas and possibly provide a more uniformly lit display device 700.

In one embodiment, the dent depth 830, as shown in FIG. 8, and the dent to dent spacing 930, as shown in FIG. 9, may be in a range of less than about 100 micrometers. In various embodiments, the depth, width, and shape of a dent may be varied to improve the light extraction efficiency. Further, spacing 930 between the dents 928 may also be varied to improve the light extraction efficiency. In various embodiments, the spacing and the depth may not be discernable to a naked human eye.

Referring to FIG. 8, a schematic diagram of a display device 800 is provided. The device 800 can include a layer 810. The layer 810 can include a substrate with a plurality of OLEDs 814 and 816 disposed at a distance 818 over the substrate 812. The light 820 emitted from the OLEDs 814, 816, can pass through the substrate 812. The light emissive areas 822, 824, defined on the layer 810 roughly correspond to the OLEDs 814, 816. The light non-emissive area 826 defined on the layer 810 roughly corresponds to the distances 818, at which the OLEDs 814, 816 are disposed on the substrate 812. Dents 828 with varying depth 830 and a fixed spacing 832 can be disposed over the light non-emissive area 826.

Referring to FIG. 9, a schematic diagram of a display device 900 is provided. The device 900 can include a layer 910. The layer 910 can include a substrate with a plurality of OLEDs 914 and 916 disposed at a distance 918 over the substrate 912. The light 920 emitted from the OLEDs 914, 916, can pass through the substrate 912. The light emissive areas 922, 924, defined on the layer 910 roughly correspond to the OLEDs 914, 916. The light non-emissive area 926 defined on the layer 910 roughly corresponds to the distances 918, at which the OLEDs 914, 916 are disposed on the substrate 912. Dents 928 with varying spacing 930 between the dents and a fixed depth 932 can be disposed over the light non-emissive area 926.

Figure 10:
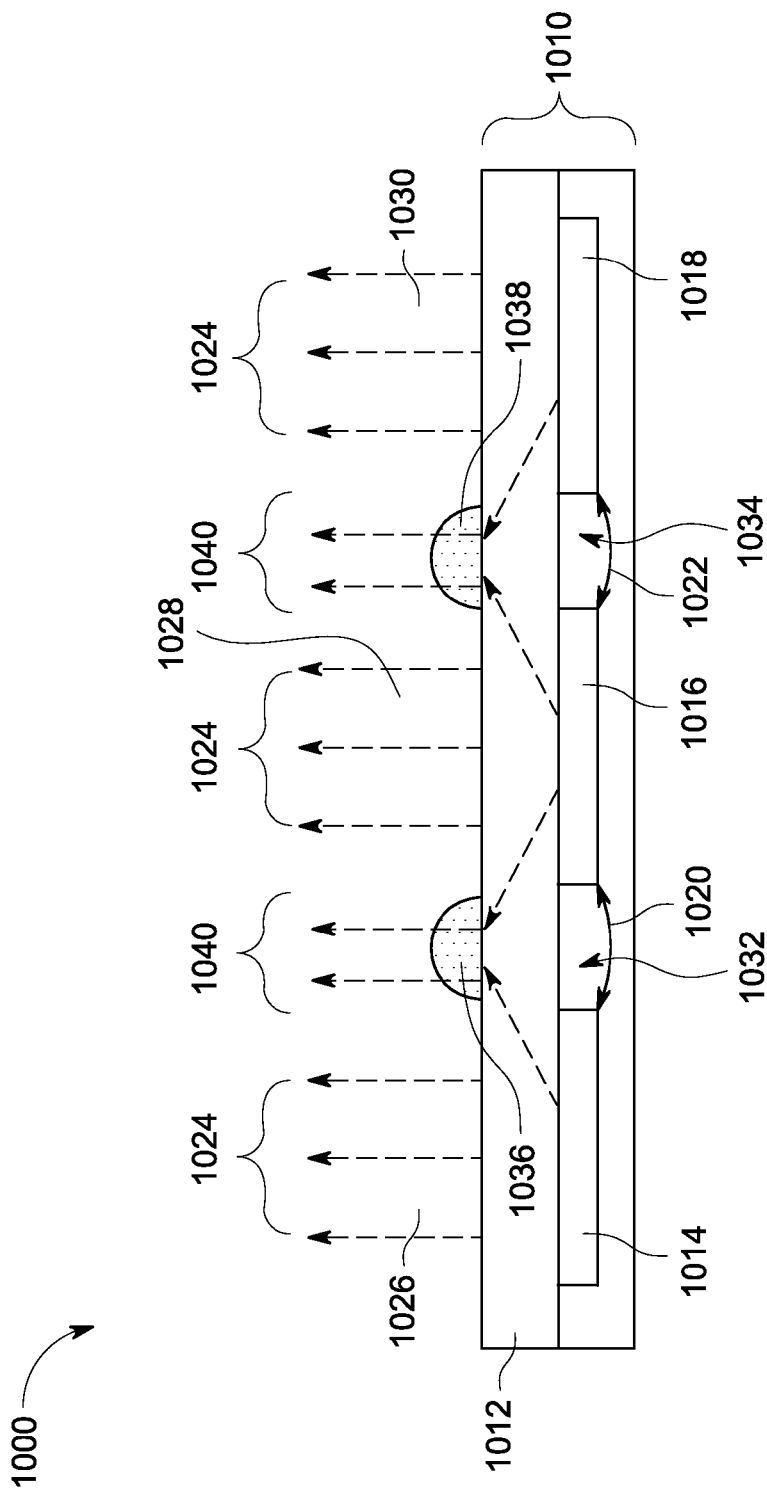
FIG. 10 is a schematic view of a display device in accordance with one embodiment.

Referring to FIGS. 5 and 10, in one embodiment, the light-extracting features 534, 536 can comprise refractive index matching elements 1036, 1038 disposed over the light non-emissive areas 1032, 1034 in the layer 1010. In various embodiments, the refractive index matching elements 1036, 1038 can reduce the light extraction loss due to Fresnel reflection that occurs at the interface between the refractive index matching elements 1036, 1038 and the layer 1010 on which the refractive index elements 1036, 1038 are disposed.

Figure 11:
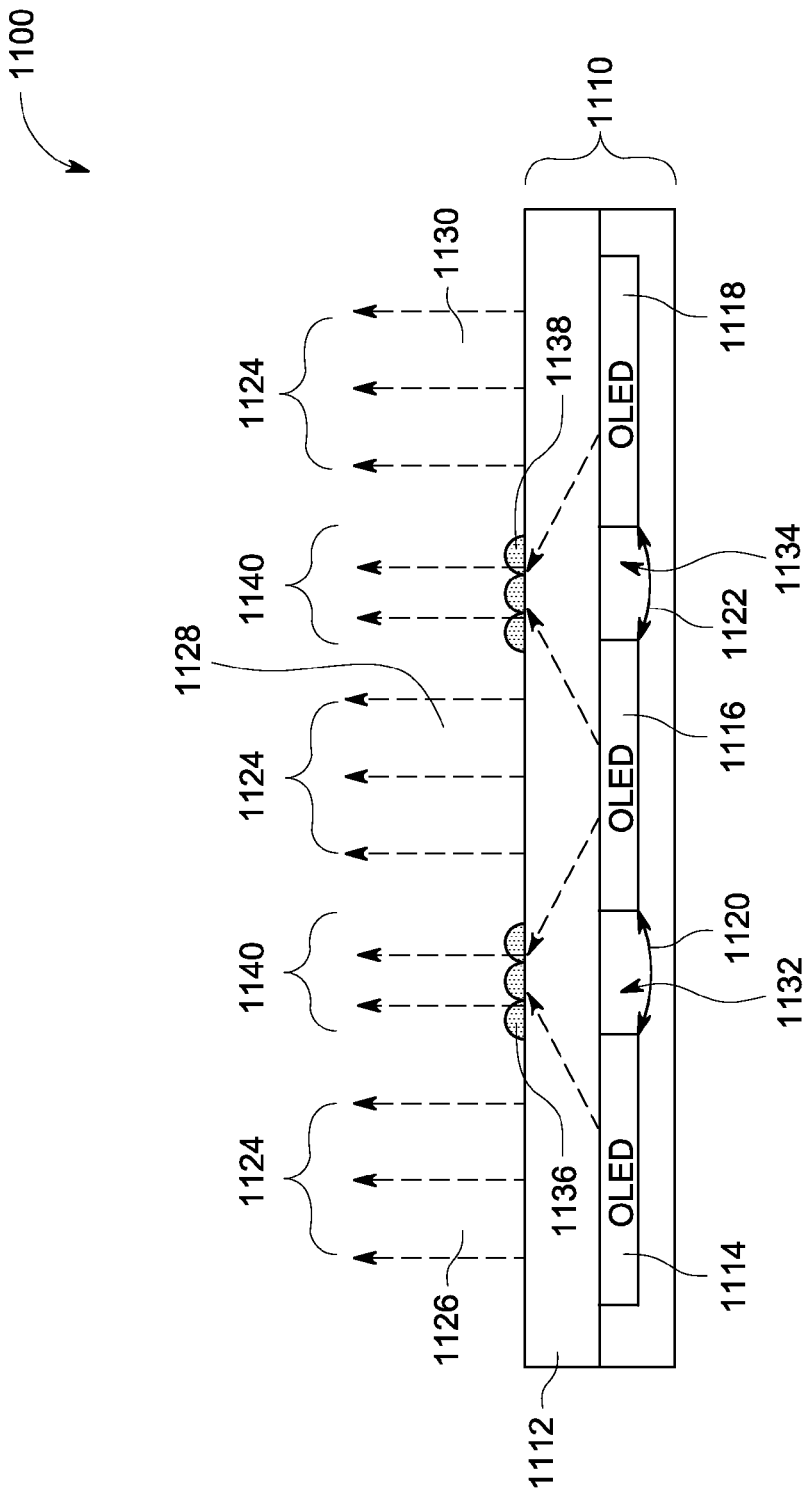
FIG. 11 is a schematic view of a display device in accordance with one embodiment.

In one embodiment, the refractive index matching element 1036, 1038 can include spheres. In one embodiment, a semi-sphere like feature 1036, 1038 having same refractive index as the layer 1010 of the display device 1000 may help in improving light extraction efficiency of the display device 1000. Referring to FIG. 11, in one embodiment, the refractive index matching element includes micro-spheres 1136, 1138. Micro-sphere feature 1136, 1138 may include two-dimensional arrays of spheres with diameter in a range of micrometers to tens of micrometers. The micro-sphere array 1136, 1138 can be ordered or disordered (random). All micro-spheres can have same or similar diameters or the micro-spheres can have a range of different diameters. Referring to FIG. 11, in one embodiment, the refractive index matching element includes micro-lenses 1236, 1238. Micro-lens feature 1236, 1238 can include two-dimensional arrays of micro lenses in any shape, for example, spheres, semi-spheres, or pyramids, or any shape of features that could improve the light extraction efficiency from the layer 1210. In one embodiment, the micro-lens features may be made of materials having a refractive index roughly equal to that of the layer 1210 of the display device 1200 described below. The micro-lens features may be made of materials having low absorption to light that is emitted from the layer 1210 of the device 1200.

Referring to FIG. 10, a schematic diagram of a display device 1000 is provided. The device 1000 can include a layer 1010. The layer 1010 can include a substrate 1012 with a plurality of OLEDs 1014, 1016, and 1018 disposed at a distance 1020, and 1022, over the substrate 1012. The light 1024 emitted from the OLEDs 1014, 1016, and 1018 can pass through the substrate 1012. The light emissive areas 1026, 1028, and 1030 defined on the layer 1010 roughly correspond to the OLEDs 1014, 1016, and 1018. The light non-emissive areas 1032 and 1034, defined on the layer 1010 roughly correspond to the distances 1020, and 1022, at which the OLEDs 1014, 1016, and 1018 are disposed on the substrate 1012. Light-extracting features, for example, refractive index matching spheres, 1036 and 1038 can be disposed over some or all of the light non-emissive areas 1030 and 1032. The refractive index matching spheres, 1036 and 1038 can serve to extract the light 1040 from the layer 1010, possibly providing a more uniformly lit display device 1000. At least some of the light 1040 extracted from the non-emissive areas using the refractive index matching spheres 1036 and 1038 may be light that would otherwise be subject to a wave-guide mode of propagation within the layer 1010.

Referring to FIG. 11, a schematic diagram of a display device 1100 is provided. The device 1100 can include a layer 1110. The layer 1110 can include a substrate 1112 with a plurality of OLEDs 1114, 1116, and 1118 disposed at a distance 1120, and 1122, over the substrate 1112. The light 1124 emitted from the OLEDs 1114, 1116, and 1118 can pass through the substrate 1112. The light emissive areas 1126, 1128, and 1130 defined on the layer 1110 roughly correspond to the OLEDs 1114, 1116, and 1118. The light non-emissive areas 1132 and 1134, defined on the layer 1110 roughly correspond to the distances 1120, and 1122, at which the OLEDs are 1114, 1116, and 1118 are disposed on the substrate 1112. Light-extracting features, for example, refractive index matching micro-spheres, 1136 and 1138 can be disposed over some or all of the light non-emissive areas 1132 and 1134. The refractive index matching micro-spheres, 1136 and 1138 can serve to extract the light 1140 from the layer 1110, possibly providing a more uniformly lit display device 1100. At least some of the light 1140 extracted from the non-emissive areas using the refractive index matching micro-spheres 1136 and 1138 may be light that would otherwise be subject to a wave-guide mode of propagation within the layer 1110.

Figure 12:
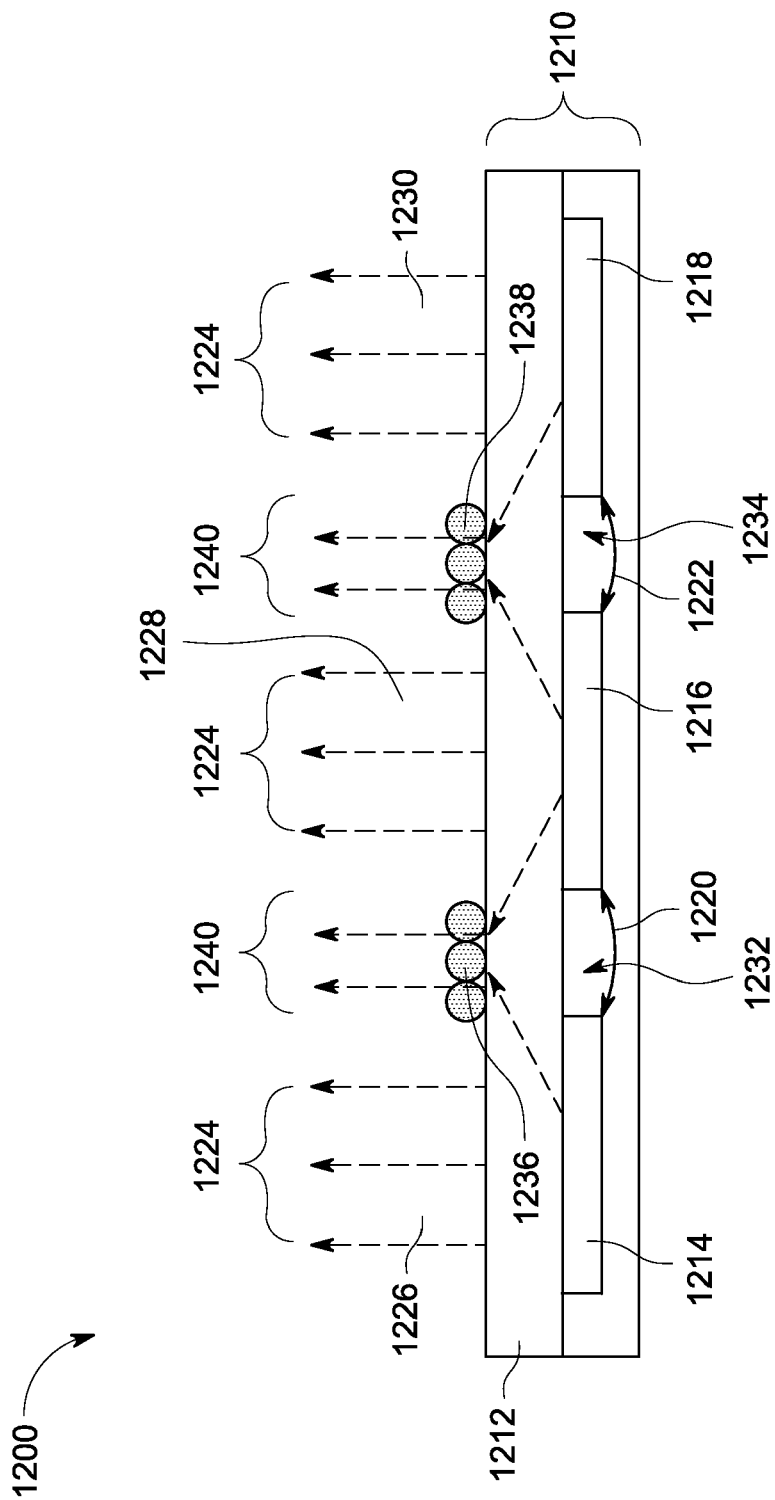
FIG. 12 is a schematic view of a display device in accordance with one embodiment.

Referring to FIG. 12, a schematic diagram of a display device 1200 is provided. The device 1200 can include a layer 1210. The layer 1210 can include a substrate 1212 with a plurality of OLEDs 1214, 1216, and 1218 disposed at a distance 1220, and 1222, over the substrate 1212. The light 1224 emitted from the OLEDs 1214, 1216, and 1218 can pass through the substrate 1212. The light emissive areas 1226, 1228, and 1230 defined on the layer 1210 roughly correspond to the OLEDs 1214, 1216, and 1218. The light non-emissive areas 1232 and 1234, defined on the layer 1210 roughly correspond to the distances 1220, and 1222, at which the OLEDs are 1214, 1216, and 1218 are disposed on the substrate 1212. Light-extracting features, for example, refractive index matching micro-lenses, 1236 and 1238 can be disposed over some or all of the light non-emissive areas 1232 and 1234. The refractive index matching micro-lenses, 1236 and 1238 can serve to extract the light 1240 from the layer 1210, possibly providing a more uniformly lit display device 1200. At least some of the light 1240 extracted from the non-emissive areas using the refractive index matching micro-lenses 1236 and 1238 may be light that would otherwise be subject to a wave-guide mode of propagation within the layer 1210.

Figure 13:
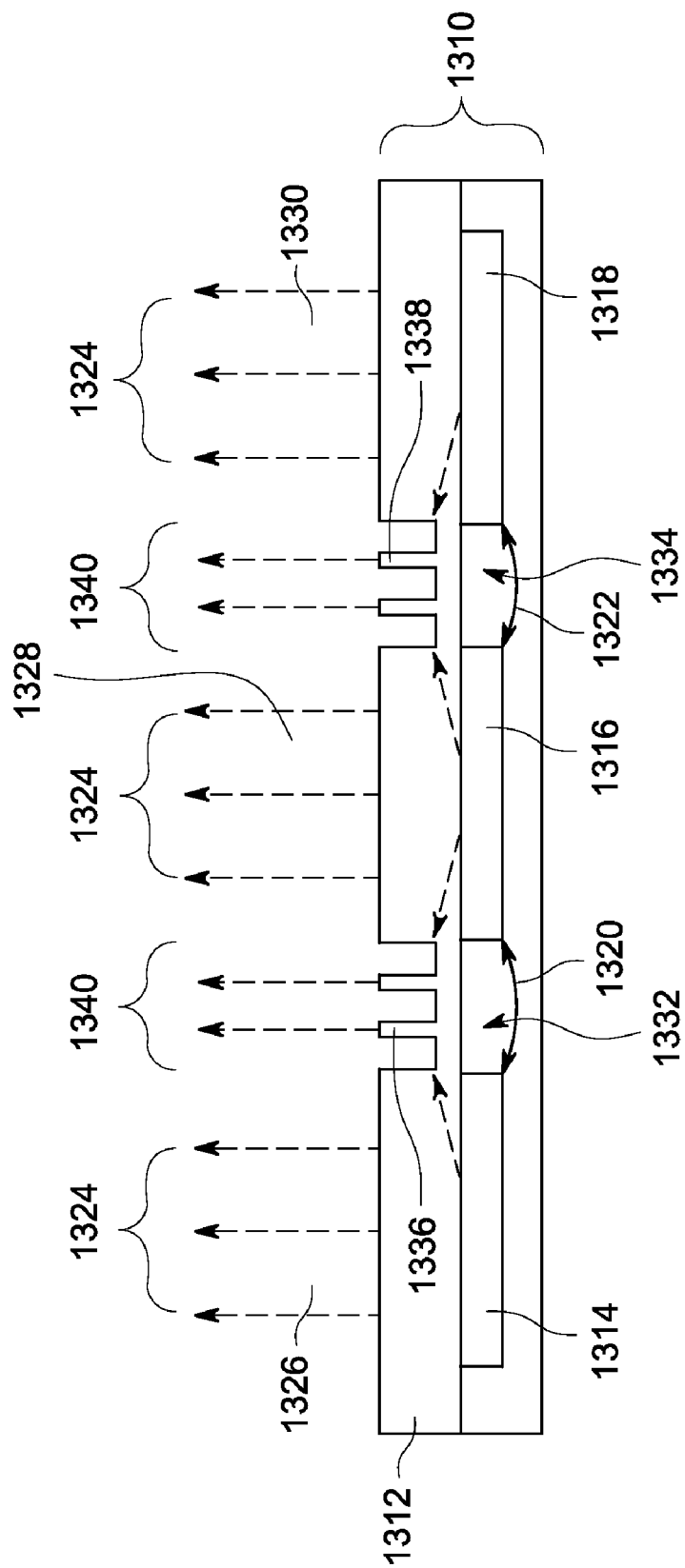
FIG. 13 is a schematic view of a display device in accordance with one embodiment.

Referring to FIGS. 5 and 13, in one embodiment, the light extracting features 536, 538, can include a two-dimensional photonic crystal feature 1336, 1338 disposed over the light non-emissive area 1332, 1334, in the layer 1310. Two-dimensional photonic crystals may be composed of periodic dielectric or metallo-dielectric nanostructures that may affect the propagation of electromagnetic waves (EM) in a manner similar to the periodic potential in a semiconductor crystal affects the electron motion by defining allowed and forbidden electronic energy bands. The photonic crystals may contain regularly repeating internal regions of high and low dielectric constant. Two-dimensional photonic crystals may effectively control the lateral modes of light propagation in OLEDs.

Referring to FIG. 13, a schematic diagram of a display device 1300 is provided. The device 1300 can include a layer 1310. The layer 1310 can include a substrate 1312 with a plurality of OLEDs 1314, 1316, and 1318 disposed at a distance 1320, and 1322, over the substrate 1312. The light 1324 emitted from the OLEDs 1314, 1316, and 1318 can pass through the substrate 1312. The light emissive areas 1326, 1328, and 1330 defined on the layer 1310 roughly correspond to the OLEDs 1314, 1316, and 1318. The light non-emissive areas 1332 and 1334, defined on the layer 1310 roughly correspond to the distances 1332 and 1334, at which the OLEDs are 1314, 1316, and 1318 are disposed on the substrate 1312. Light-extracting features, for example, two dimensional photonic crystals, 1336 and 1338 can be disposed over some or all of the light non-emissive areas 1332 and 1334. The two dimensional photonic crystals, 1336 and 1338 can serve to extract the light 1340 from the layer 1310, possibly providing a more uniformly lit display device 1300. At least some of the light 1340 extracted from the non-emissive areas 1332 and 1334 using the two dimensional photonic crystals 1336 and 1340 may be light that would otherwise be subject to a wave-guide mode of propagation within the layer 1310.

Figure 14:
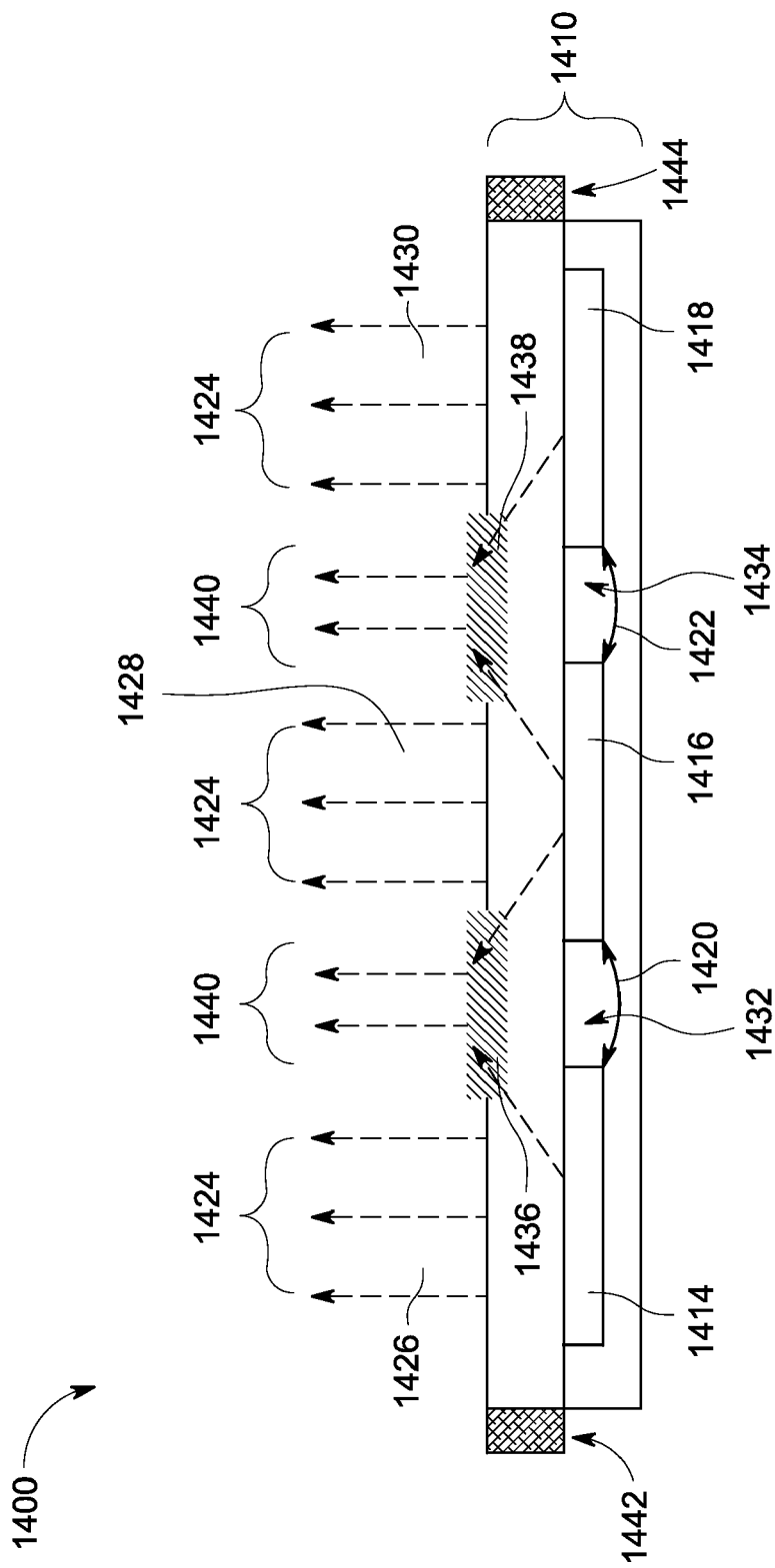
FIG. 14 is a schematic view of a display device in accordance with one embodiment.

In one embodiment, the display device 1400 as shown in FIG. 14 below, can comprise a reflective coating 1442, 1444 at the edges of the layer 1410. Adding a reflective coating 1442, 1444 around the edges of the layer 1410 may block the light leakage at the edges and therefore, the photons are recycled many times in the layer 1410 and eventually get extracted out at the designed features 1436, 1438 disposed over the non-emissive areas 1432, 1434. In one embodiment, the reflective coating 1442, 1444 may provide high efficiency light extraction even with a light extraction feature having a low extraction efficiency. In one embodiment, the reflective coating 1442, 1444 may be combined with all different features in the non-emissive area as discussed above in FIG. 5 to FIG. 13. Non-limiting examples of reflective coatings 1442, 1444 can include metal layers such as Ag, Al, Cu, Au, Ba, Ca, and alloy comprising at least two of the foregoing.

Referring to FIG. 14, a schematic diagram of an OLED device 1400 is provided. The device 1400 can include a layer 1410. The layer 1410 can include a substrate 1412 with a plurality of OLEDs 1414, 1416, and 1418 disposed at a distance 1420, and 1422, over the substrate 1412. The light 1424 emitted from the OLEDs 1414, 1416, and 1418 can pass through the substrate 1412. The light emissive areas 1426, 1428, and 1430 on the layer 1410 roughly correspond to the OLEDs 1414, 1416, and 1418. The light non-emissive areas 1432 and 1434, on the layer 1410 roughly correspond to the distances 1420 and 1422, at which the OLEDs 1414, 1416, and 1418 are disposed on the substrate 1412. Light-extracting features 1436 and 1438 can be disposed over some or all of the light non-emissive areas 1432 and 1434. The light-extracting features 1436 and 1438 can serve to extract the light 1440 from the layer 1410, possibly providing a more uniformly lit display device 1400. At least some of the light 1440 extracted from the non-emissive areas using the light extracting features 1436 and 1438 may be light that would otherwise be subject to a wave-guide mode of propagation within the substrate 1412. Additionally a reflective coating 1442 and 1444 is disposed on the edges of the OLED device. The reflective coating may assist in blocking the light leakage at the edges of the device.

Figure 15:
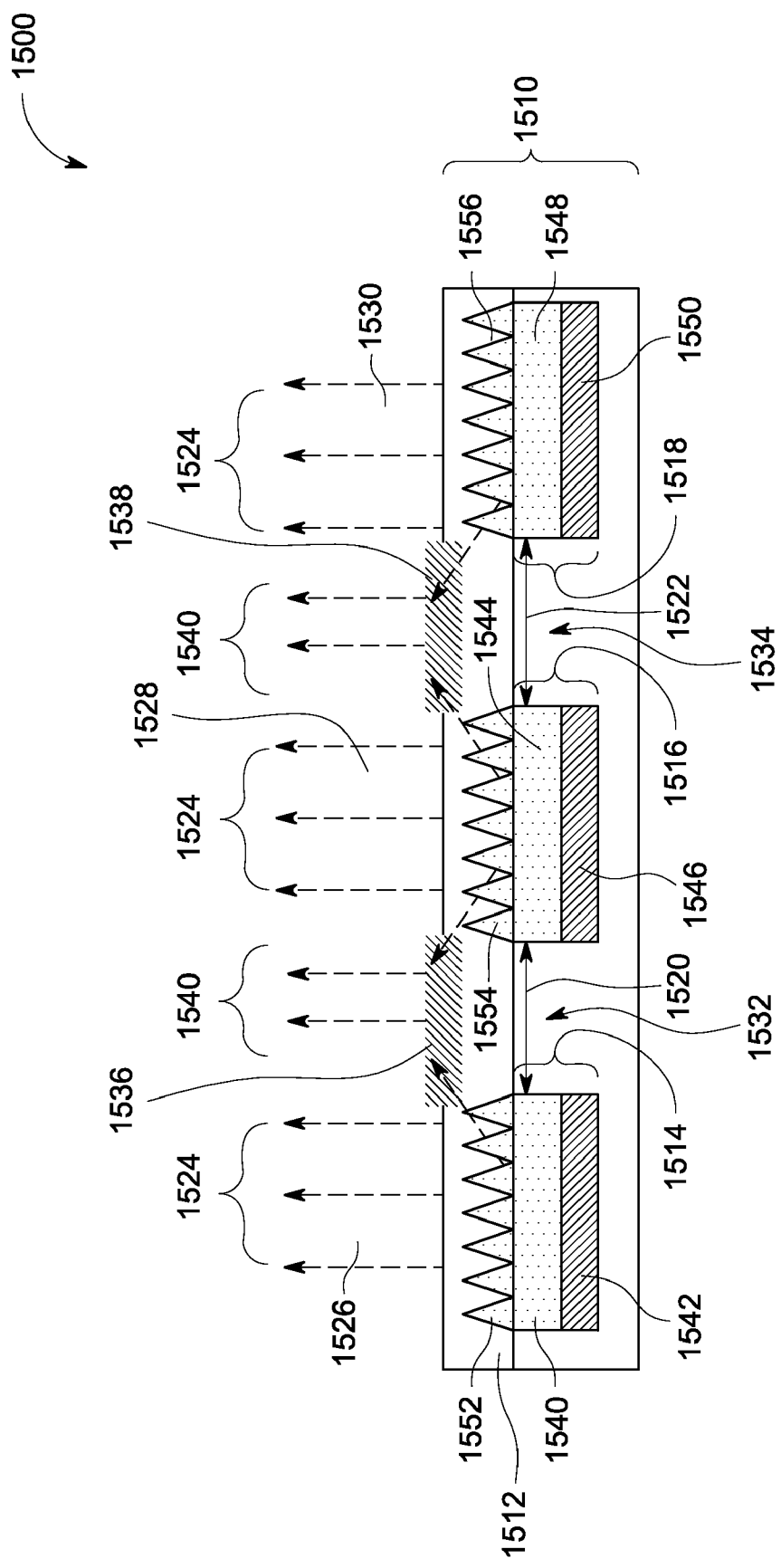
FIG. 15 is a schematic view of a display device in accordance with one embodiment.

Referring to FIG. 15, in one embodiment, a display device 1500 may further comprise refractive index matching features 1552, 1554, and 1556 disposed between the transparent conductive oxide layer 1540, 1544, and 1548 present in the OLEDs 1514, 1516, 1518 and the substrate 1512. The transparent conductive oxide layer can form the anode in the OLEDs. The refractive index matching features may serve to extract the light that would otherwise be subject to a wave-guide mode of propagation between the substrate 1510 and the transparent conductive oxide layer 1540, 1544, and 1548.

Still referring to FIG. 15, a schematic diagram of an OLED device 1500 is provided. The device 1500 can include a layer 1510. The layer 1510 can include a substrate 1512 with a plurality of OLEDs 1514, 1516, and 1518 disposed at a distance 1520, and 1522, over the substrate 1512. The light 1524 emitted from the organic emissive layers 1542, 1546, and 1550 in the OLEDs 1514, 1516, and 1518 can pass through the substrate 1512. The light emissive areas 1526, 1528, and 1530 on the layer 1510 roughly correspond to the OLEDs 1514, 1516, and 1518. The light non-emissive areas 1532 and 1534, on the layer 1510 roughly correspond to the distances 1520, and 1522, at which the OLEDs are disposed on the substrate 1512. Light-extracting features 1536 and 1538 can be disposed over some or all of the light non-emissive areas 1532 and 1534. The light-extracting features 1536 and 1538 can serve to extract the light 1540 from the layer 1510, possibly providing a more uniformly lit display device 1500. At least some of the light 1540 extracted from the non-emissive areas using the light-extracting features 1536 and 1538 may be light that would otherwise be subject to a wave-guide mode of propagation within the substrate 1512. In certain embodiments, as shown in FIG. 15, the OLEDs 1514, 1516, and 1518 can include an emissive layer 1542, 1546, and 1550 respectively and an transparent conductive oxide layer 1540, 1544, and 1548 that form the anode in the OLEDs. A refractive index matching feature 1552, 1554, and 1556 can be disposed between the transparent conductive oxide layer 1540, 1544, and 1548 in the OLEDs 1514, 1516, and 1518 and the substrate 1512. The refractive index matching feature 1552, 1554, and 1556 can include a periodic sub-wavelength structure comprising a prism or cone shaped structure. The refractive index matching features 1552, 1554, and 1556 can serve to extract at least a portion of the light 1524, 1540 from the layer 1510, possibly providing a more uniformly lit display device 1500. At least some of the light 1524, 1540 extracted from the emissive area and non-emissive areas respectively using the light extracting features 1552, 1554, and 1556 may be light that would otherwise be subject to a wave-guide mode of propagation between the substrate 1512 and the transparent conductive oxide layer 1540, 1544, and 1548.

In one embodiment, a display device 1500 may further comprise refractive index matching layer 1552 disposed between the transparent conductive oxide layer 1540, 1544, and 1548 present in the OLEDs 1514, 1516, 1518 and the substrate 1512. The refractive index matching layer may serve to extract the light that would otherwise be subject to a wave-guide mode of propagation between the substrate 1510 and the transparent conductive oxide layer 1540, 1544, and 1548.

Figure 16:
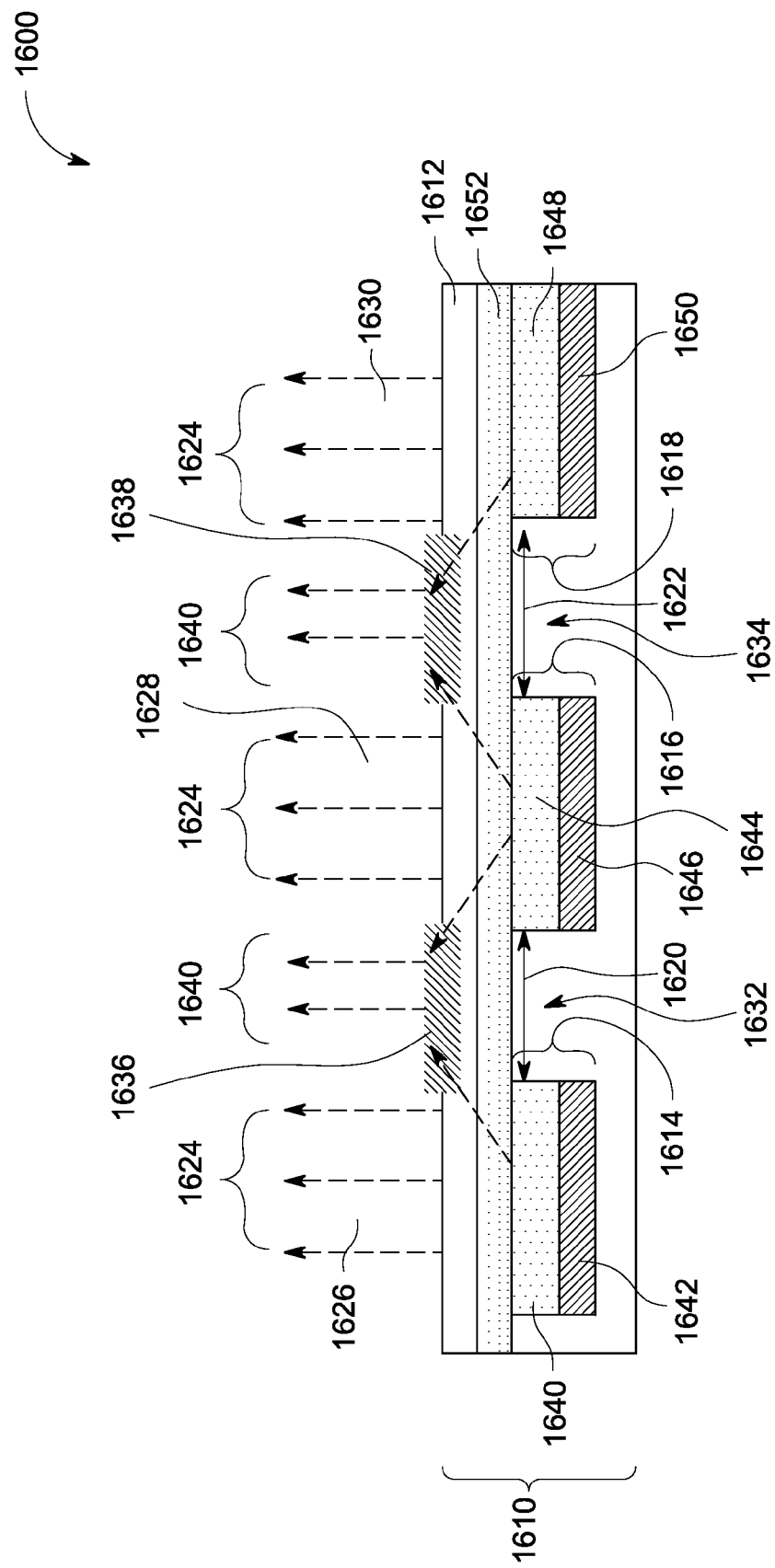
FIG. 16 is a schematic view of a display device in accordance with one embodiment.

Referring to FIG. 16, a schematic diagram of an OLED device 1600 is provided. The device 1600 can include a layer 1610. The layer 1610 can include a substrate 1612 with a plurality of OLEDs 1614, 1616, and 1618 disposed at a distance 1620, and 1622, over the substrate 1612. The light 1624 emitted from the organic emissive layers 1642, 1646, and 1650 in the OLEDs 1614, 1616, and 1618 can pass through the substrate 1612. The light emissive areas 1626, 1628, and 1630 on the layer 1610 roughly correspond to the OLEDs 1614, 1616, and 1618. The light non-emissive areas 1632 and 1634, on the layer 1610 roughly correspond to the distances 1620, and 1622, at which the OLEDs are disposed on the substrate 1612. Light-extracting features 1636 and 1638 can be disposed over some or all of the light non-emissive areas 1632 and 1634. The light-extracting features 1636 and 1638 can serve to extract the light 1640 from the layer 1610, possibly providing a more uniformly lit display device 1600. At least some of the light 1640 extracted from the non-emissive areas using the light-extracting features 1636 and 1638 may be light that would otherwise be subject to a wave-guide mode of propagation within the substrate 1612. In certain embodiments, as shown in FIG. 16, the OLEDs 1614, 1616, and 1618 can include an emissive layer 1642, 1646, and 1650 respectively and a transparent conductive oxide layer 1640, 1644, and 1648 that form the anode in the OLEDs. A refractive index matching layer 1652 can be disposed between the transparent conductive oxide layer 1640, 1644, and 1648 in the OLEDs 1614, 1616, and 1618 and the substrate 1612. The refractive index matching layer 1652 can include a periodic sub-wavelength structure comprising a prism or cone shaped structure. The refractive index matching layer 1652 can serve to extract at least a portion of the light 1624, 1640 from the layer 1610, possibly providing a more uniformly lit display device 1600. At least some of the light 1624, 1640 extracted from the emissive area and non-emissive areas respectively using the light extracting layer 1652 may be light that would otherwise be subject to a wave-guide mode of propagation between the substrate 1612 and the transparent conductive oxide layer 1640, 1644, and 1648.

Referring again to FIG. 5, a device 500 is provided in another embodiment. The device 500 includes a layer 510 and a plurality of light-emitting elements, for example OLEDs 514, 516, and 518 disposed at a distance 520, 522, from each other on the layer. The layer 510 can define a plurality of light-emissive areas 526, 528, and 530 and light non-emissive areas 532 and 534. The layer 510 can comprise a plurality of light emissive areas 526, 528, and 530 roughly corresponding to the plurality of light-emitting elements 514, 516, and 518 and a plurality of light non-emissive areas 532, 534 roughly corresponding to the distance 520, 522 between the plurality of light-emitting elements 514, 516, and 518. A light-extracting feature 536, 538 can be disposed over one or more of the plurality of light non-emissive areas 532, 534 in the layer 510.

In one embodiment, the distance 520, 522 between the light-emitting elements 514, 516, 518 can be in a range of from about 10 micrometers to about 10 millimeters. In another embodiment, the distance between the light-emitting elements 514, 516, 518 is in a range of from about 100 micrometers to about 5 millimeters. In yet another embodiment the distance between the light-emitting elements 514, 516, 518 is in a range of from about 500 micrometers to about 3 millimeters.

Figure 17:
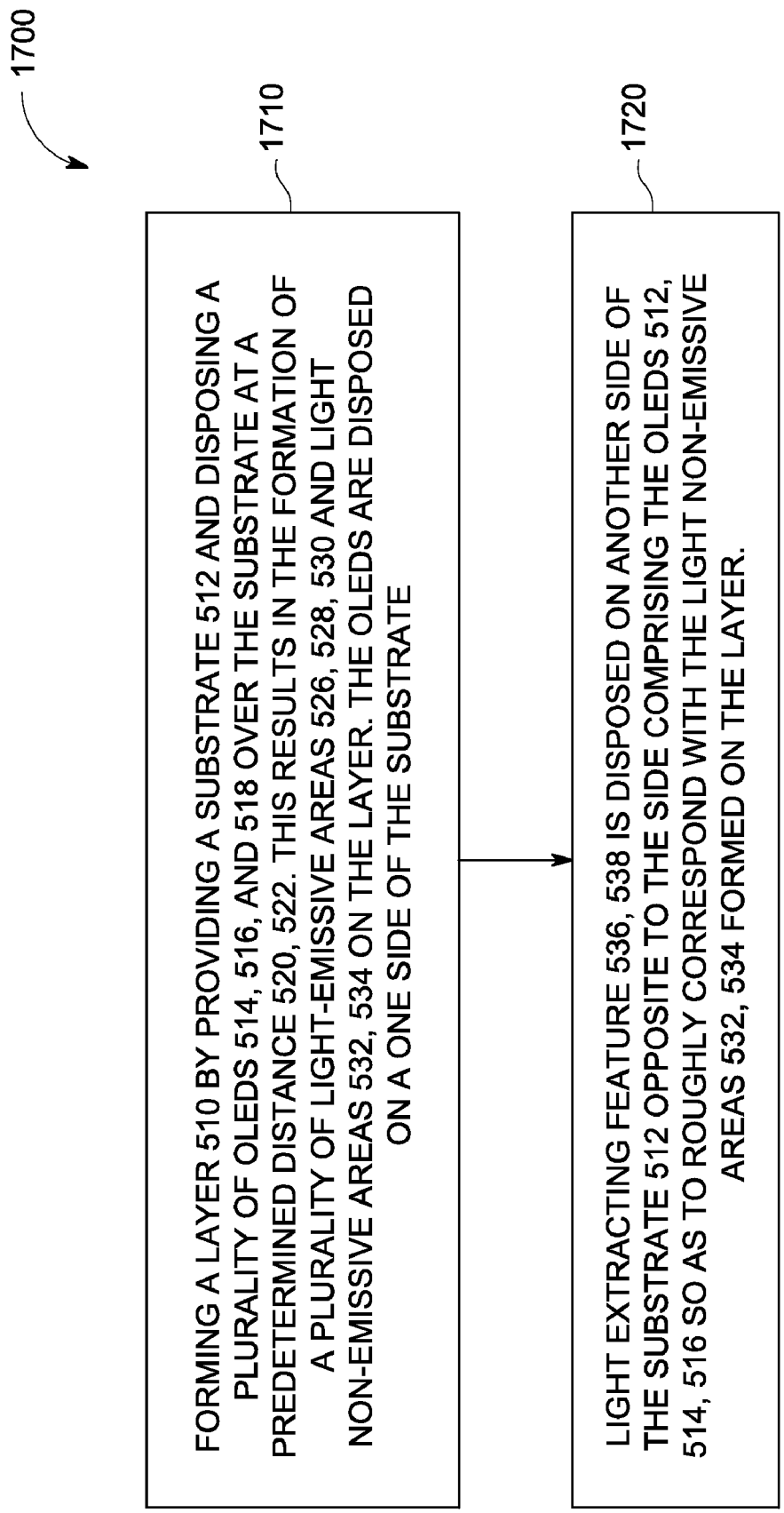
FIG. 17 is a schematic view of a method of forming a display device in accordance with one embodiment.

Referring to FIG. 17, therein is provided a flow chart representative of a method 1700 for producing a display device configured in accordance with the above description (e.g., the display device 500 shown in FIG. 5, which figure is also referenced below). The method can comprise providing a layer 510 that supports a plurality of light-emitting elements 514, 516, and 518. The plurality of light-emitting elements 514, 516, and 518 are disposed at a pre-determined distance 520, 522 from each other. This results in the formation of a plurality of light emissive areas 526, 528, 530, corresponding to the plurality of light-emitting elements 514, 516, and 518 on the layer 510 and forming a plurality of light non-emissive areas 532, 534, corresponding to the pre-determined distance 520, 52 between the light-emitting elements 514, 516, and 518 in the layer 510. The method 1700 further comprises disposing light-extracting features 536, 538 so as to correspond with the plurality of light non-emissive areas 532, 534 on the layer 510.

Referring to FIGS. 6, 7 and 17, in different embodiments, the light-extracting features may comprise surface aberrations 636, 638, 736, and 738. In one embodiment, the surface aberrations may include a scratch 636, 638 or a dent 736, 738. In various embodiments, the scratches or dents may be formed using a carbide scribe tool, a razor blade, diamond grid dicing wheel, and other methods known to one skilled in the art to form optical quality scratches or dents.

Referring to FIGS. 10, 11, 12 and 17, in different embodiments, the light-extracting features can comprise refractive index matching features 1036, 1038, 1136, 1138, 1236, and 1238. In one embodiment, the features include spheres 1036, 1038, micro-spheres 1136, 1138 or micro lenses 1236, and 1238. In various embodiments micro-spheres or micro lens can be fabricated by performing photolithography into materials such as photoresist or UV curable epoxy and melting the polymer to form arrays of multiple lenses. Other embodiments can include making multiple copies of micro-lens or micro-spheres by molding or embossing from a master lens array. The master lens array may also be replicated through the generation of an electroform using the master lens array as a mandrel.

Referring to FIGS. 13 and 17, in one embodiment, the light extracting feature comprises two dimensional photonic crystals 1336, 1338. In various embodiments, two-dimensional photonic crystals can be fabricated using photolithography and etching techniques similar to those used for integrated circuits. Alternate approaches to form the two-dimensional photonic crystals can include growing the photonic crystals as self-assembled structures from colloidal crystals.

The light generation mechanism in OLEDs may be the recombination of excitons on electrically excited organic molecules of the OLED substrate. When such light is generated, it radiates from the organic emission layer spontaneously in all the directions and propagates via various modes. The various modes include those associated with light escaping from the OLED substrate (referred to as "external modes") and/or those associated with light that is subject to total internal reflection within the OLED substrate (referred to as "wave guided modes"). For display applications, light emitted from the substrate surface (i.e., light propagating via an external mode) is most useful, as this represents the light that is received by viewers of the display. However, in some cases, a large amount of generated light may be associated with wave guided modes, as shown in FIG. 18 below (e.g., being either trapped inside the substrate and device, or emitted out from the edges of the OLED device), with only limited amounts of light reaching a viewer of the OLED. For example, the fraction of generated light escaping from the substrate may be approximated by $$\eta_{cp,ext} \sim \tfrac{1}{2} n^2_{org} \quad (1)$$

where $\eta_{cp,ext}$ is external coupling efficiency and $n_{org}$ is total number of ITO/organic layers. The fraction of light trapped in the substrate $\eta_{cp,subs}$ and in the ITO/organic layers $\eta_{cp,org}$ are given by, respectively, $$\eta_{cp,subs} = \cos\theta_{org,c1} - \cos\theta_{org,c2} \quad (2)$$

$$\eta_{cp,org} = \cos\theta_{org,c2} \quad (3)$$

where $\theta_{org,c1}$ and $\theta_{org,c2}$ are the critical angles between organic layer-air and organic layer-substrate, respectively. For the purpose of applications in general illumination and flat panel displays, light emitted from the substrate surface ($\eta_{cp,ext}$) is most useful which is only 20 percent of the total emitted light from a display device, for example, the display device 300 referred to in FIG. 3.

Figure 18:
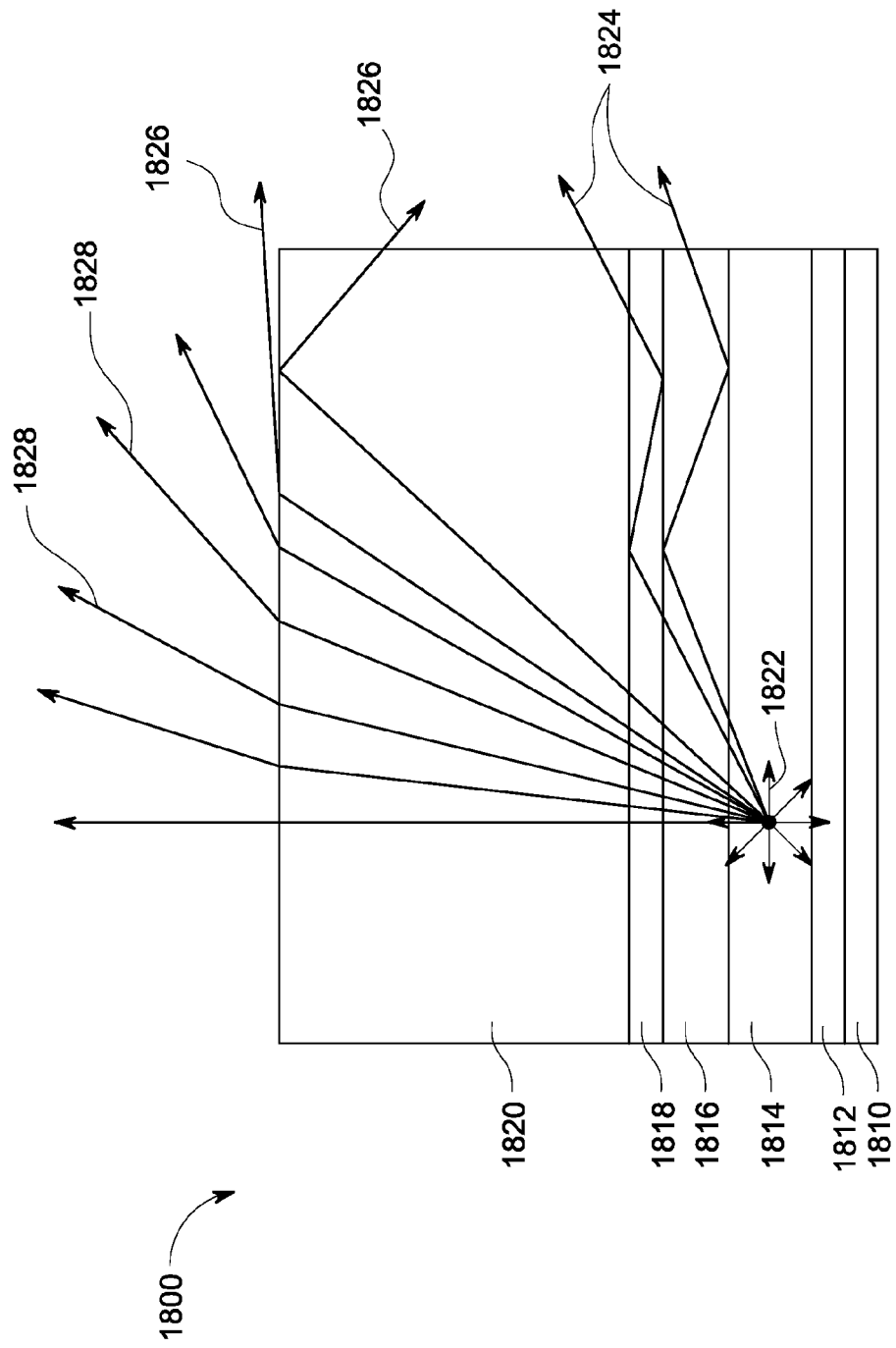
FIG. 18 is a schematic view depicting the various modes of propagation of light generated in a display device in accordance with one embodiment.

Referring to FIG. 18, therein is depicted the various modes of propagation of light generated in a typical OLED structure 1800. The OLED structure 1800 can comprise a cathode layer 1810, an electron transport layer 1812, an emissive layer 1814, a hole transport layer 1816, a transparent conducive oxide layer 1818, and a substrate layer 1820. Light emitted by the emissive layer 1814 may be lost due to various modes. Light may fail to be emitted so as to be received by a viewer due to refraction 1822, due to ITO/organic wave guided mode 1824, due to substrate wave guided modes 1826, and due to escape for the edges of the substrate 1828.

Embodiments configured in accordance with the above description may act to reduce the amount of light that is subject to wave guided modes of propagation by, for example, a reduction in the total internal reflection at the substrate air interface to increase the escape of substrate modes and/or a modification of the relative number of the organic/ITO, substrate and escape modes. The former process can be achieved, for example, through substrate surface modifications such as roughening or attaching silica microspheres or microlenses. The latter process can be achieved by, for example, corrugating the emission region, altering the refractive index of layers in the device, and/or patterning the device to produce photonic crystal behavior.

Applicants have found that one method of increasing the output coupling is by increasing the surface roughness of the substrate-air interface. This method can enable some of the light that would normally be totally internally reflected to be scattered at different angles, and thus, escape from the surface. Applicants have also found that increased scattering can also be achieved by using periodic patterning of the surface with silica spheres. Techniques have also been tested whereby the geometry of the surface is altered to reduce the total internal reflection and enhance surface emission. The use of microlenses attached to the front surface has also been successful. Using hemispheres designed such that emission occurs at the centre of the sphere means that rays impinging on the glass air interface may be at normal incidence and therefore escape. Through the use of these and other techniques, the wave-guide modes, which would normally be confined to the substrate, can be efficiently coupled out of the device. Enhancements may be achieved with smaller scale patterning and the use of microlenses and patterned mesas.

Embodiments as described herein may address the noted shortcomings of the art. The light-emitting features described herein may provide an improved light extraction mechanism from the light non-emissive areas in pixel-based display devices. These devices could potentially offer improved efficiency and cost. Accordingly the embodiments described herein provide a device that includes a layer comprising a light emissive area and a light non-emissive area. A light-extracting feature is disposed over the light non-emissive area. The light-extracting feature may serve to modify the surface of the transparent layer of the display device thereby minimizing light loss due to waveguide modes. In one embodiment, the surface modification may include physically changing the surface by mechanically scratching, or embossing, denting at the light-non-emissive areas. In another embodiment, the surface modification may include attaching light extraction elements that have a refractive index roughly equal to the transparent layer of the display devices at the light-non-emissive areas. In various embodiments, the light extraction elements may include spheres, micro-lens arrays, two dimensional photonic crystal structures, trapezoidal shapes, or pyramidal shapes of materials that have the appropriate refractive index.

Referring again to FIG. 5, in one embodiment, the display device 500 may include additional layers (not shown in figure) such as one or more of a barrier layer, an abrasion resistant layer, an adhesion layer, a chemically resistant layer, a photoluminescent layer, a radiation-absorbing layer, a radiation reflective layer, a planarizing layer, an optical diffusing layer, and a light management film. These layers may also be present in the other embodiments contemplated herein.

Securing or disposing the various layers discussed herein may be carried out using known techniques such as spin coating, dip coating, reverse roll coating, wire-wound or MAYER rod coating, direct and offset gravure coating, slot die coating, blade coating, hot melt coating, curtain coating, knife over roll coating, extrusion, air knife coating, spray coating, rotary screen coating, multilayer slide coating, coextrusion, meniscus coating, comma and microgravure coating, lithographic processes, langmuir processes, and flash evaporation, vapor deposition, plasma-enhanced chemical-vapor deposition "PECVD", radio-frequency plasma-enhanced chemical-vapor deposition "RFPECVD", expanding thermal-plasma chemical-vapor deposition "ETPCVD", electron-cyclotron-resonance plasma-enhanced chemical-vapor deposition "ECRPECVD", inductively coupled plasma-enhanced chemical-vapor deposition "ICPECVD", and sputtering techniques including reactive sputtering.

The embodiments described herein are examples of compositions, structures, systems and methods having elements corresponding to the elements of the invention recited in the claims. This written description may enable those of ordinary skill in the art to make and use embodiments having alternative elements that likewise correspond to the elements of the invention recited in the claims. The scope of the invention thus includes compositions, structures, systems and methods that do not differ from the literal language of the claims, and further includes other structures, systems and methods with insubstantial differences from the literal language of the claims. While only certain features and embodiments have been illustrated and described herein, many modifications and changes may occur to one of ordinary skill in the relevant art. The appended claims cover all such modifications and changes.

The invention claimed is:

1. A device comprising:
    a layer having a light emissive area and a light non-emissive area; and
    a light-extracting feature disposed over the light non-emissive area;
    wherein the light-extracting feature comprises surface aberrations disposed over the light non-emissive area in the layer.

2. The device of claim 1, wherein the light-extracting feature comprises dents or scratches disposed over the light non-emissive area in the layer.

3. The device of claim 1, wherein the light-extracting feature comprises refractive index matching elements disposed over the light non-emissive area in the layer.

4. The device of claim 1, wherein the light-extracting feature comprises refractive index matching spheres disposed over the light non-emissive area in the layer.

5. The device of claim 1, wherein the light-extracting feature comprises refractive index matching micro-lens disposed over the light non-emissive area in the layer.

6. The device of claim 1, wherein the light-extracting feature comprises refractive index matching micro-spheres disposed over the light non-emissive area in the layer.

7. The device of claim 1, wherein the light-extracting feature comprises a two-dimensional photonic crystal feature disposed over the light non-emissive area in the layer.

8. The device of claim 1, wherein the device further comprises reflective coatings at edges of the layer.

9. The device of claim 1, wherein the device further comprises a transparent conductive oxide layer disposed over the layer, and a refractive index matching feature is disposed between the transparent conductive oxide layer and the layer.

10. The device of claim 1, wherein the device further comprises a transparent conductive oxide layer disposed over the layer, and a refractive index matching layer is disposed between the transparent conductive oxide layer and the layer.

11. A method comprising:
    providing a layer that supports a plurality of light-emitting elements, wherein the plurality of light-emitting elements are disposed at a pre-determined distance from each other;
    resulting in the formation of a plurality of light emissive areas, corresponding to the plurality of light-emitting elements on the layer and formation of a plurality of light non-emissive areas, corresponding to the pre-determined distance between the light-emitting elements in the layer; and
    disposing a light extracting feature so as to correspond with the plurality of light non-emissive areas on the layer;
    wherein the disposing a light-extracting feature comprises disposing surface aberrations over the plurality of non-emissive areas in the layer.

12. The method of claim 11, wherein the wherein the disposing a light-extracting feature comprises disposing a refractive index matching element over the plurality of non-emissive areas in the layer.

* * * * *